(12) United States Patent
Wijeyesekera et al.

(10) Patent No.: US 6,404,615 B1
(45) Date of Patent: Jun. 11, 2002

(54) THIN FILM CAPACITORS

(75) Inventors: Sunil D. Wijeyesekera, Pleasanton; Jing Jing, San Jose; Donald C. Benson, Cupertino; Teruo Sasagawa, Los Gatos, all of CA (US)

(73) Assignee: Intarsia Corporation, Fremont, CA (US)

( * ) Notice: Subject to any disclaimer, the term of this patent is extended or adjusted under 35 U.S.C. 154(b) by 0 days.

(21) Appl. No.: 09/505,491

(22) Filed: Feb. 16, 2000

(51) Int. Cl.$^7$ ................................................ H01G 4/228
(52) U.S. Cl. .................... 361/306.1; 361/309; 361/312; 257/306; 257/310
(58) Field of Search .......................... 361/306.1, 306.2, 361/306.3, 307, 309, 310, 311–313, 303; 257/301, 305, 303, 306, 310, 532

(56) References Cited

U.S. PATENT DOCUMENTS

| | | | |
|---|---|---|---|
| 3,821,617 A | * | 6/1974 | Shelby et al. |
| 4,146,439 A | | 3/1979 | Randall, Jr. |
| 4,421,785 A | | 12/1983 | Kroger |
| 4,430,662 A | | 2/1984 | Jille, Jr. et al. |
| 4,481,084 A | | 11/1984 | Chen et al. |
| 4,550,069 A | | 10/1985 | Pampalone |
| 4,589,961 A | | 5/1986 | Gershenson |
| 4,675,717 A | | 6/1987 | Herrero et al. |
| 4,936,957 A | | 6/1990 | Dickey et al. |
| 5,046,043 A | * | 9/1991 | Miller et al. ................. 365/145 |

(List continued on next page.)

OTHER PUBLICATIONS

Gretchen M. Adema, Lin–Tyng Hwang, Glenn A. Rinne, and Iwona Turlik, "Passivation Schemes for Copper/Polymer Thin–Film Interconnections Used in Multichip Modules," IEEE Transactions of Components, Hybrids, and Manufacturing Technology, vol. 16, No. 1, pp. 53–59, Feb. 1993.

S.G. Byeon and Y. Tzeng, "Improved Oxide Properties by Anodization of Aluminum Films with Thin Sputtered Aluminum Oxide Overlays," Journal of the Electrochemical Society, vol. 135 No. 10, pp. 2452–2458 (Oct. 1988).

T. Dobashi, T. Umezawa, and K. Sasaki, "Effects of Heat–Treatment on Dielectric Properties of Anodized Al–Ta Double Oxide Layer Thin–Film Capacitors," Electronics and Communications in Japan, Part 2 vol. 71, No. 2 pp. 98–105 (1988).

V. Surganov, "Planarized Thin Film Inductors and Capacitors for Hybrid Integrated Circuits Made of Aluminum and Anodic Alumina," IEEE Transactions on Components. Packaging and Manufacturing Technology, Part B. vol. 17, No. 2, pp. 197–200 (May 1994).

C.W. Liang et al., "Characterization of anodic aluminum oxide film and its application to amorphous silicon thin film transistors," Materials Chemistry and Physics 43, pp. 166–172 (1996).

(List continued on next page.)

Primary Examiner—Anthony Dinkins
(74) Attorney, Agent, or Firm—Blakely, Sokoloff, Taylor & Zafman LLP

(57) ABSTRACT

A thin film capacitor and methods for forming the same are described. The capacitor has dielectric layer with a first face, a second face, and at least one edge. The first terminal of the capacitor covers at least a portion of the first face of the dielectric layer, covers at least a portion of one edge of the dielectric layer, and covers a portion of the second face of the dielectric layer. The second terminal of the capacitor covers a portion of the second face of the dielectric layer and does not contact the first terminal. A method for forming the thin film capacitor includes hard baking photoresist at an elevated temperature and anodizing an exposed metal area using the photoresist as a mask.

21 Claims, 14 Drawing Sheets

U.S. PATENT DOCUMENTS

| | | | |
|---|---|---|---|
| 5,071,509 A | | 12/1991 | Kano et al. |
| 5,134,539 A | | 7/1992 | Tuckerman et al. |
| 5,141,603 A | | 8/1992 | Dickey et al. |
| 5,227,012 A | | 7/1993 | Brandli et al. |
| 5,241,636 A | | 8/1993 | Kohn |
| 5,254,493 A | | 10/1993 | Kumar |
| 5,258,886 A | | 11/1993 | Murayama et al. |
| 5,304,506 A | | 4/1994 | Porter et al. |
| 5,316,982 A | | 5/1994 | Taniguchi |
| 5,323,138 A | | 6/1994 | Oki et al. |
| 5,355,277 A | | 10/1994 | Hoshiba |
| 5,356,826 A | | 10/1994 | Natsume |
| 5,363,080 A | | 11/1994 | Breen |
| 5,366,920 A | | 11/1994 | Yamamichi et al. |
| 5,370,766 A | | 12/1994 | Desaigoudar et al. |
| 5,398,400 A | | 3/1995 | Breen |
| 5,416,356 A | | 5/1995 | Staudinger et al. |
| 5,420,558 A | | 5/1995 | Ito et al. |
| 5,440,157 A | | 8/1995 | Imai et al. |
| 5,442,585 A | | 8/1995 | Eguchi et al. |
| 5,450,263 A | | 9/1995 | Desaigoudar et al. |
| 5,478,773 A | | 12/1995 | Dow et al. |
| 5,479,316 A | * | 12/1995 | Smrtic et al. ............... 361/322 |
| 5,481,131 A | | 1/1996 | Staudinger et al. |
| 5,488,008 A | | 1/1996 | Kawamura |
| 5,503,878 A | | 4/1996 | Suzuki et al. |
| 5,528,083 A | | 6/1996 | Malladi et al. |
| 5,563,762 A | * | 10/1996 | Leung et al. ............ 361/301.4 |
| 5,708,559 A | * | 1/1998 | Brabazon et al. ........... 361/313 |
| 5,874,770 A | * | 2/1999 | Saia et al. .................. 257/536 |

OTHER PUBLICATIONS

G.C. Schwartz and V. Platter, "An Anodic Process for Forming Planar Interconnection Metallization for Multilevel LSI," Journal of Electrochemical Society, pp. 1508–1516 (Nov. 1975).

W.J. Bernard and J. W. Cook, "The Growth of Barrier Oxide Films on Aluminum," Journal of the Electrochemical Society, pp. 643–646 (Aug. 1959).

T. Takken and D. Tuckerman, "Integral Decoupling Capacitance Reduces Multichip Module Ground Bounce," IEEE Multichip Module Conference, Santa Cruz, California (Mar. 1993).

R.R. Kola et al, "Thin Film Resistors and Capacitors for Advanced Packaging," International Symposium on Advanced Packaging Materials, pp. 71–74 (Mar. 1997).

Product Bulletin for AZ P4000 Photoresist, Hoechst Celanese, 1995.

W.F. Gum et al., "Reation Polymers: Polyurethanes, Epoxies, Unsaturated Polyesters, Phenolics, Special Monomers, and Additives," Chemistry, Technology, Applications, Markets, pp. 65–79, 91–96 Hanser Publishers (1992).

N.H. Kordsmeier, Jr. et al., "Electronic Materials and Processes,Advanced Packaging Concepts—Microelectronics Multiple Chip Modules Utilizing Silicon Substrates," Society for the Advancement of Material and Process Engineering, 1st International Sampe Electronics Conference, vol. 1 pp. 36–45, Doubletree Hotel, Santa Clara, California (Jun. 23–25, 1987).

F.F. Mazda, "Electronics Engineer's Reference Book," Sixth Edition, pp. 26/3–26/12 (1989).

Elizabeth Logan, et al., "Advanced Packaging of Integrated Passive Devices for RF Applications," "Preliminary VCO Layout" and "RF Component Integration," (Aug. 12, 1998).

David J. Elliot, "Integrateed Circuit Fabrication Technology," pp. vii–xvii, 1–86, 101–163, 233–309, McGraw–Hill (1982).

R.H. Perry et al., "Perry's Chemical Engineer's Handbook," Sixth Edition, pp. 23/48, McGraw–Hill (1984).

* cited by examiner

THIN FILM CAPACITORS

FIELD OF THE INVENTION

The present invention pertains to the field of passive electronic components. In particular, the invention relates to thin film capacitors and methods for forming the thin film capacitors.

BACKGROUND OF THE INVENTION

Integrated circuits ("ICs") are typically mounted on printed circuit boards that contain and interconnect other active (e.g., ICs) and passive components (e.g., capacitors, inductors, and resistors). Many of the prior art passive components are discrete passive components—i.e., individual capacitors, inductors, and resistors. Many prior art printed circuit boards use wire traces to interconnect ICs mounted on these boards and discrete passive components mounted on these boards.

There are a number of disadvantages, however, to using discrete passive components. Discrete passive components typically take up relatively large amounts of valuable space on printed circuit boards, which works against miniaturization. Discrete passive components also add cost. There is the cost of the discrete passive components themselves. There is also the cost of attaching multiple discrete passive components to a printed circuit board. A further disadvantage is that relatively long interconnection paths typically associated with discrete passive components can sometimes reduce switching speeds, especially as average switching speeds have increased.

Passive components (i.e., capacitors, inductors, and resistors) have, however, in the prior art been integrated on a single substrate with or without other ICs.

Anodization has been used in the prior art to produce integrated capacitors in an attempt to produce capacitors with relatively high capacitance density, relatively high breakdown voltage, relatively tight tolerances, and relatively low fabrication costs. The thin film integrated capacitors have been made by anodizing a continuous layer of metal and then selectively etching the anodized metal.

Because anodization is a self-limiting process, it is typically possible to obtain tight tolerances without the need for any post-process trimming. By picking certain metals to anodize—such as tantalum and aluminum—it is also possible to get relatively high breakdown voltages and relatively high capacitance densities. Anodization has been used to create aluminum decoupling capacitors for multichip modules. These aluminum coupling capacitors typically have relatively high capacitance density, relatively high breakdown voltages, and relatively tight tolerances. Tantalum oxide capacitors that have been produced typically have higher capacitance densities than aluminum capacitors but lower breakdown voltages.

Both aluminum and tantalum capacitors have been fabricated by anodizing a continuous layer of an anodizable metal and then patterning the metal by selectively etching away the area between the capacitors, a process known as subtractive etching. Although subtractive etching can successfully pattern capacitors, the process is often tedious and typically uses hazardous chemicals that are subject to strict environmental regulation. In addition, many of these processes are subject to problems with photoresist lifting. Successful manufacturing can require 100% inspection of the parts during manufacturing combined with a substantial yield loss from the parts that failed. For example, one process for preparing aluminum oxide capacitors uses an etchant containing $CrO_3$, which is a heavily regulated chemical with possible carcinogenic properties. An alternative process for etching aluminum oxide uses hydrofluoric acid, which requires an intermediate hard bake during the etching process to avoid photoresist lifting. Many of the oxides that are produced during anodization are very hard to etch and typically require the use of hazardous or highly regulated chemicals.

Selective anodization has been used for various prior art processes. A disadvantage of prior art selective anodization has been that with photoresist as an anodization mask, the adhesion between the photoresist and the surface of the metal can be so weak during anodization that sometimes serious lateral anodization results. In other words, undercutting can be a problem. Thus, the anodized areas sometimes cannot be formed in an exact shape.

Different prior art approaches have been used in an attempt to improve the dimensional control of the anodized areas. For example, a barrier layer has been used to help prevent lateral oxide growth. Other examples involve the use of deposited insulators or anodizable metal as anodization masks. These approaches typically introduce more process complexity or increase reliability problems. For example, the deposition of an insulator can sometimes physically damage the top layer of anodic oxide, which can sometimes degrade the junction properties.

SUMMARY OF THE INVENTION

A thin film capacitor and methods for forming the same are described. The capacitor has a dielectric layer with a first face, a second face, and at least one edge. The first terminal of the capacitor covers at least a portion of the first face of the dielectric layer, covers at least a portion of one edge of the dielectric layer, and covers a portion of the second face of the dielectric layer. The second terminal of the capacitor covers a portion of the second face of the dielectric layer and does not contact the first terminal. The method for forming the thin film capacitor includes hard baking a photoresist at an elevated temperature and anodizing an exposed metal area using the photoresist as a mask.

Other features and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

Thin film capacitors are described. Methods for forming the thin film capacitors are also described.

As described in more detail below, one of the embodiments of the invention is a thin film capacitor that resides on a substrate that also can include other semiconductor components (e.g., integrated circuits, transistors, and diodes) and other passive components (e.g., inductors, resistors and other capacitors). One of the intended advantages is to thus provide an integrated, rather than discrete, capacitor. Integrated passive components take up less space than discrete components and can reduce the interconnection distance between components, helping to avoid possible performance penalties sometimes associated with long interconnection paths. Another intended advantage is to help to reduce costs as compared to some uses of discrete components. Certain embodiments of the invention can be employed in multi-chip modules and silicon interconnect substrates ("SIS").

Another intended advantage of embodiments of the invention is to provide a thin film integrated capacitor that has a relatively high capacitance density, a relatively high breakdown voltage, and has relatively tight tolerances.

The thin film capacitor of one embodiment of the invention has an anodized layer that acts as the dielectric of the capacitor. The thin film capacitor has a first terminal that (1) covers the bottom of the anodized dielectric layer, (2) extends beyond the edges of the anodized dielectric layer, (3) wraps around the edges of the anodized dielectric layer, and (4) resides over outer portions of the top of the anodized dielectric layer. In other words, the first terminal of the capacitor has C-shaped ends. The second terminal of the capacitor covers a portion of the top of the anodized dielectric layer. The second terminal of the capacitor does not contact the first terminal of the capacitor.

An intended advantage of having the first terminal of the capacitor extend beyond the anodized dielectric layer is to help to avoid having lateral overhang of the anodized layer caused by undercutting during a metal etching fabrication step. This results in a more desirable capacitor structure because there are no reentrant shapes. Another intended advantage of the configuration of the first terminal of the capacitor is that the portion of the C-shaped end of the first terminal of the capacitor that resides over a portion of the top of the anodized dielectric layer can be used to provide an electrical connection to the first terminal of the capacitor. Thus, connections to both the first and second terminals of the thin film capacitor can be made from the top of the thin film capacitor. In other words, there can be electrical interconnection to the capacitor in the same plane. Moreover, connections can still be made to the first terminal of the capacitor from the bottom of the thin film capacitor.

Figure 1:
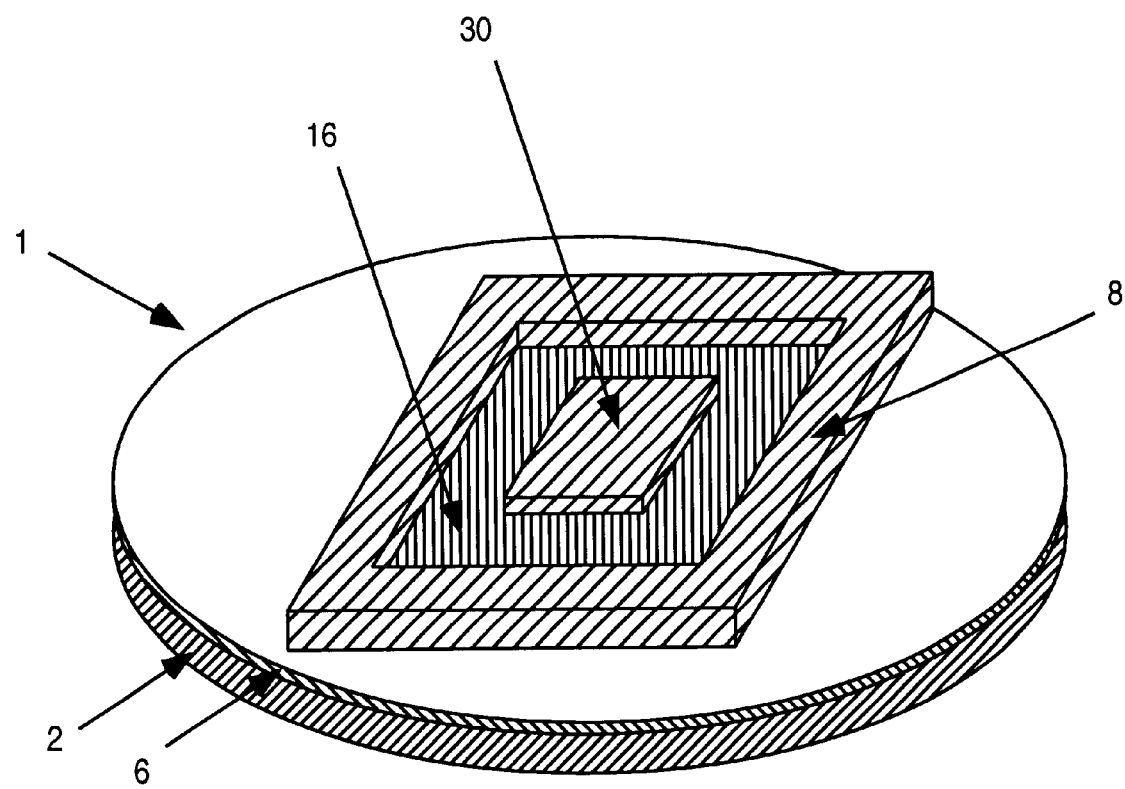
FIG. 1 is a perspective view of one embodiment of the capacitor of the present invention.
Figure 2:
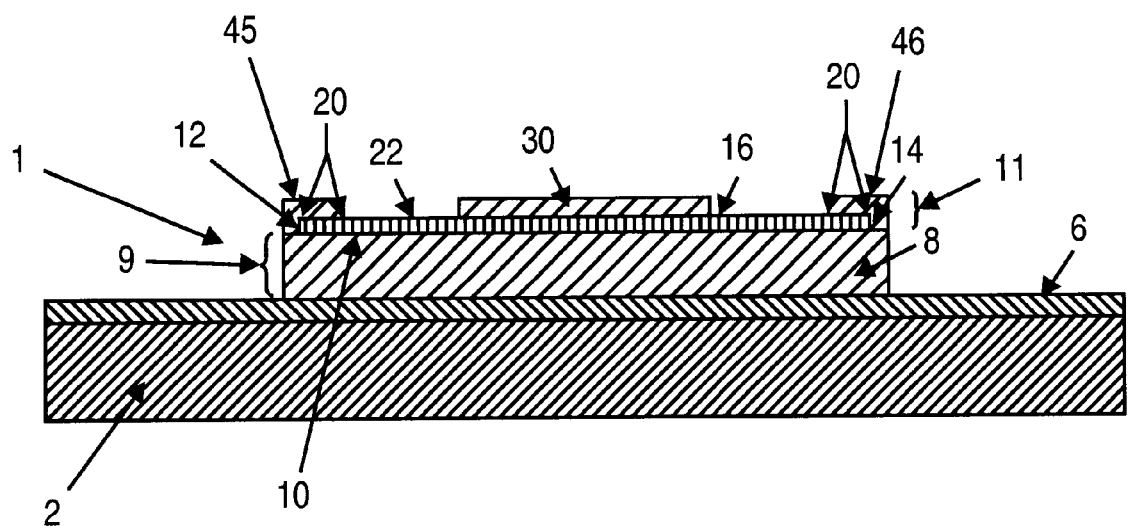
FIG. 2 is a cross-section view of the embodiment of FIG. 1.
Figure 3:
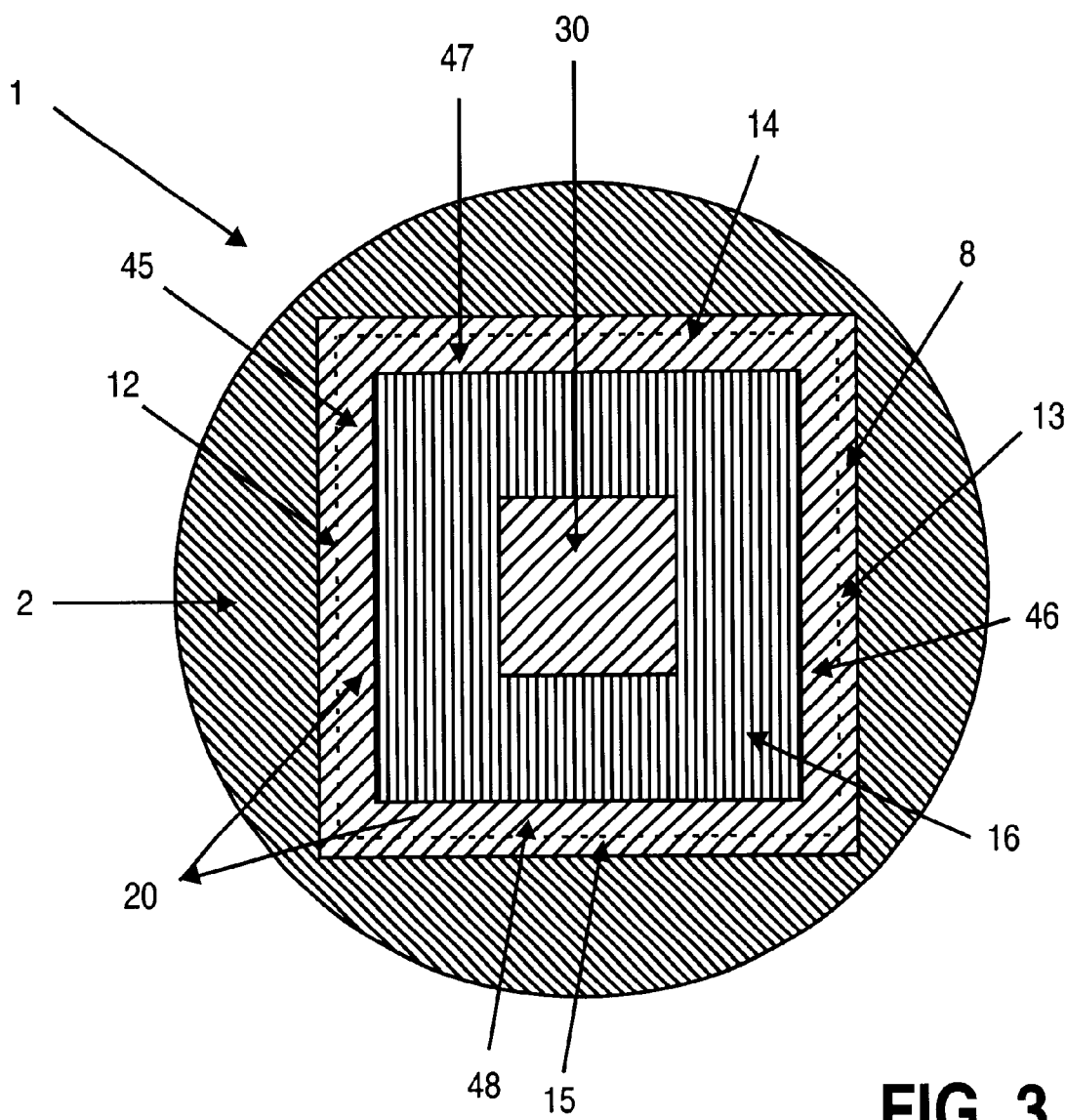
FIG. 3 is a top view of the embodiment of FIG. 1.

FIG. 1 shows thin film capacitor 1, which is one embodiment of the present invention. FIGS. 1 through 3 show that the capacitor 1 is mounted upon a substrate 2 having an insulative layer 6. Formed on the insulative layer 6 is a first terminal 8 that contacts and completely underlies one face 10 of dielectric layer 16. The first terminal 8 of capacitor 1 also contacts and covers each of edges 12–15 of dielectric layer 16. The first terminal 8 also includes top regions 45–48 that contact and cover peripheral portion 20 of the opposite face 22 of dielectric layer 16. For the embodiment shown in FIGS. 1–3, face 10 of dielectric layer 16 is the lower face and face 22 of dielectric layer 16 is the upper face. Second terminal 30 of capacitor 1 contacts opposite face 22 of dielectric layer 16 to provide a second electrode of capacitor 1. The capacitance value (i.e., farads) of capacitor 1 is proportional to the area of opposite face 22 of dielectric layer 16 covered by second terminal 30.

First terminal 8 is also referred to as first plate 8, first electrode 8, and first conductor 8. Second terminal 30 is also referred to as second plate 30, second electrode 30, and second conductor 20.

As shown in FIG. 2, for one embodiment first terminal 8 is made of a first conductive layer 9 and a second conductive layer 11. The first conductive layer 9 resides underneath dielectric layer 16. For one embodiment, first conductive layer 9 covers all of face 10 of dielectric layer 16. For an alternative embodiment, first conductive layer 9 only covers a portion of face 10 of dielectric layer 16. Dielectric layer 16 is also referred to as dielectric element 16 or just dielectric 16.

For one embodiment, the second conductive layer 11 is the portion of first terminal 8 that wraps around the edge of dielectric layer 16 and overlies a portion of face 22 of dielectric layer 16. For alternative embodiments, dielectric layer 16 may have different shapes and second conductive layer 11 wraps around at least a portion of at least one edge of dielectric layer 16.

For one embodiment, the process used to form second conductive layer 11 is also used to form second terminal 30. In other words, second conductive layer 11 and second terminal 30 can be formed from the same metal layer. For an alternative embodiment, however, second conductive layer 11 and second terminal 30 need not be made from the same metal layer.

For one embodiment, capacitor 1 is mounted upon a substrate 2 as illustrated in FIGS. 1–3. For alternative embodiments of capacitor 1, however, there need not be any substrate.

For the embodiments of capacitor 1 with a substrate, the substrate 2 may be comprised of any suitable material such as a ceramic, a glass, a metal, a plastic, a semiconductor, or combinations thereof. Examples of ceramics include (1) oxides of aluminum, zirconium, beryllium, and silicon, and (2) nitrides of silicon, aluminum, and boron. Examples of metals include copper, nickel, iron, silver, molybdenum, aluminum, and alloys thereof. Examples of plastics include polyamides and epoxies, such as those reinforced with glass fibers. Examples of semiconductors include silicon, germanium, and gallium arsenide. The substrate 2 can also be formed from silicon carbide. For one embodiment, substrate 2 is made of silicon. For another embodiment, substrate 2 is made of glass. For the embodiment shown in FIGS. 1–3, substrate 2 is made of silicon.

When the substrate 2 is conductive (e.g. a metal or a semiconductor), the substrate 2 desirably has an insulative layer 6 to facilitate electrical isolation of other components such as resistors and inductors from each other. The insulative layer 6 is a layer that is electrically insulating. The insulative layer 6 may be, for example, (1) a plastic such as a polyamide or epoxy or (2) a ceramic such as one of the ones described above as being useful as a substrate. For the embodiments shown in FIGS. 1–3, the substrate 2 is silicon and the insulative layer 6 is an oxide of silicon. For one embodiment, this oxide-of-silicon layer 6 is a produced by thermally treating the silicon substrate in the presence of oxygen.

For one alternative embodiment that uses a substrate 2 that is made of glass (i.e., silicon dioxide), there is no need for insulative layer 6 given that the glass of the substrate itself is insulative.

For yet another alternative embodiment, an interlayer (not shown) resides on top of oxide-of-silicon layer 6 and contacts the underside of first terminal 8. For other alternative embodiments without a layer 6, then the interlayer would reside on top of substrate 2 and contact the underside of first terminal 8. The interlayer, when present, can be used to form, for example, thin film devices such as resistors at the same time the capacitor 1 is being formed. The interlayer may be made from any suitable material and method such as those known in the art for making thin film resistors. Examples of interlayer materials include tantalum nitride ("Ta—N"), nickel chromium ("Ni—C"), or a silicon chromium alloy ("Si—Cr").

Returning to the embodiment shown in FIGS. 1–3, the first terminal 8 contacts and covers (1) one face 10 entirely of dielectric layer 16, (2) each entire edge of edges 12–15 of dielectric layer 16, and (3) the peripheral portions 20 of opposite face 22 of dielectric layer 16. Even though for one embodiment the first terminal 8 contacts and completely covers one face 10 of the dielectric layer 16, for alternative embodiments there need not be full coverage so long as the first terminal 8 contacts and covers an area of face 10 that overlaps the area covered on the opposite face 22 by the second terminal 30.

The portions 45–48 of the first terminal 8 contacting the opposite face 22 of the dielectric layer 16 can be used to interconnect the first terminal 8 to other electrical components. Thus, connections to the first terminal 8 and the second terminal 30 can be made from the top of capacitor 1. Thus electrical interconnections to capacitor 1 can be made in the same plane. Alternatively, however, a connection can still be made to the portion of first terminal 8 that resides underneath dielectric layer 16.

The portions 45–48 of the first terminal 8 contacting face 22 of dielectric layer 16 may be any useful size or shape provided the first terminal 8 and the second terminal 30 are isolated from each other (i.e., fail to contact each other). Portions 45–48 of first terminal 8 cover at least a portion of face 22 of dielectric layer 16. For one embodiment, peripheral portion 20 of face 22 is covered by portions 45–48 of first terminal 8. For one embodiment, the total area of the opposite face 22 contacted and covered by portions 45–48 of the first terminal 8 is as small as practical to facilitate electrical interconnection of the first terminal 8. For one embodiment, the area of face 22 covered by portions 45–48 is at most about 10% of the area of face 22.

In addition to contacting each of faces 10 and 22 of the dielectric layer 16, the first terminal 8 contacts at least a portion of at least one edge of edges 12–15 of dielectric layer 16. For one embodiment, the first terminal 8 contacts each edge of edges 12–15 of the dielectric layer 16. As shown in FIGS. 1–3, the first terminal 8 contacts and essentially covers each edge of edges 12–15 of dielectric layer 16.

The thickness of the first terminal 8 may be any thickness suitable for making a thin film capacitor 1. For certain embodiments, the thickness may range from approximately 0.1 micrometer to 250 micrometers, although other thicknesses are possible. For certain embodiments, the first terminal 8 has a thickness between approximately 1 and 5 micrometers (i.e., microns). For one embodiment, the first terminal 8 is approximately 1.25 micrometers thick.

The conductive layers 9 and 11 of first terminal 8 may be made of any electrically conductive material useful in making a thin film capacitor 1. For certain embodiments, the conductive layer 9 of first terminal 8 is made of a metal that can be anodized or oxidized to form dielectric layer 16, such as aluminum, antimony, bismuth, hafnium, niobium, tantalum, tungsten, yttrium, zirconium, or anodizable alloys thereof. For one embodiment, conductive layer 9 is made of aluminum or an alloy thereof. For another embodiment, first conductive layer 9 is made of tantalum or an alloy thereof.

For alternative embodiments, first conductive layer 9 need not be made from a material that is anodizable. First conductive layer 9 may be made from copper or gold, for example.

The types of materials that can be used to form conductive layer 9 can also be used to form conductive layer 11. For one embodiment, conductive layer 11 of first terminal 8 is made of the same material used to make conductive layer 9. For another embodiment, conductive layer 11 of first terminal 8 is made of a different material than the material used to make conductive layer 9.

The dielectric layer 16 is a material that has a dielectric constant useful in forming capacitor 1. For certain embodiments, the dielectric constant of the dielectric layer 16 is at least about 2 when measured at the operational frequencies of the active components capacitor 1 may be interconnected to, although other dielectric constants are possible and contemplated for various embodiments.

For one embodiment, dielectric layer 16 is an anodization layer, also referred to as an anodized layer. The dielectric layer 16 can be an oxide formed from anodizing aluminum or an alloy of aluminum used to make first conductive layer 9 of first terminal 8. For another embodiment, dielectric layer 16 is an oxide formed from anodizing tantalum or an alloy of tantalum used to make conductive layer 9. For alternative embodiments, dielectric layer 16 is an oxide of another type of anodizable metal, including antimony, bismuth, hafnium, niobium, tungsten, yttrium, or zirconium, or anodizable alloys thereof.

For other embodiments, the dielectric layer 16 need not be an anodized layer or an anodization layer. Dielectric layer can be made of silicon nitride, for example. For yet other embodiments, dielectric layer is a ceramic material or other type of material. For the embodiment where dielectric layer 16 is not an anodization layer, the first conductive layer 9 could be made of a metal that is not anodizable—for example, copper.

Because the thickness of the dielectric layer 16 is inversely proportional to the capacitance of the capacitor 1, the thickness of dielectric layer 16 may be varied over a large range to provide a capacitor 1 having a desired capacitance. For certain embodiments, the thickness of the dielectric layer 16 lies within the same ranges described for the first terminal 8, although other thicknesses are possible. For one embodiment, dielectric layer 16 is approximately 0.17 micrometers thick. Because the overlap of a flat capacitor is proportional to the area of overlap of the electrodes (i.e., terminals) separated by the dielectric layer 16, the size of the capacitor 1 is set by the desired capacitance. Thus the area of the dielectric layer 16 may vary over a wide range as can the terminals 8 and 30.

The second terminal 30 may be made of the same types of materials described previously for the conductive layers 9 and 11 of first terminal 8. For one embodiment, the second terminal 30 is made of the same material as the second conductive layer 11 of first terminal 8. For alternative embodiments, the second terminal 30 is made of a different material than the material used to make second conductive layer 11. For other embodiments, second terminal 30 can be made from the same material used in conductive layer 9 or from a different material than the one used in conductive layer 9.

For certain embodiments, second terminal 30 has a thickness that can be in the range of thicknessess for first terminal 8. For alternative embodiments, second terminal 30 can have other thicknesses, however. For one embodiment, second terminal 30 has a thickness of approximately 1 micrometer.

The respective thicknesses and types of materials used for the terminals 8 and 30 affects the desired electrical properties of capacitor 1. A thicker metal or a more conductive metal used for terminals 8 and 30 can give lower parasitic resistance to capacitor 1.

When the first conductive layer 9 of first terminal 8 essentially covers one face 10 of the dielectric layer 16 as illustrated by the embodiment of FIGS. 1–3, the capacitance of the capacitor is determined by the area of contact between the second terminal 30 and dielectric layer 16.

For alternative embodiments, the capacitive structure may have more terminals. For example, the capacitive structure 40 shown in FIG. 4 has a terminal 30A, a terminal 30B, and a terminal 8. For structure 40, the terminal 8 is also called common interconnect 8 because terminal 8 acts as a common interconnect for two capacitors. One capacitor is formed from terminal 8, dielectric layer 16, and additional terminal 30A. A second capacitor is formed from terminal 8, dielectric layer 16, and additional terminal 30B.

Figure 4:
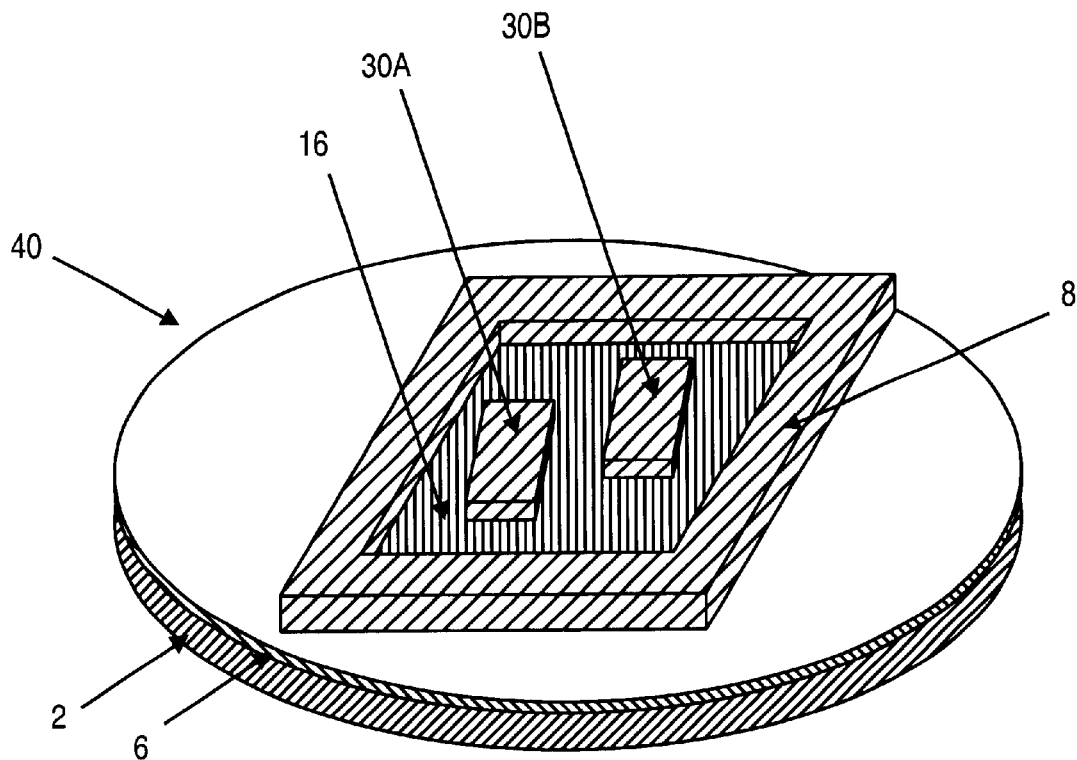
FIG. 4 is a perspective view of an alternative structure having two capacitors with a common interconnect.
Figure 5:
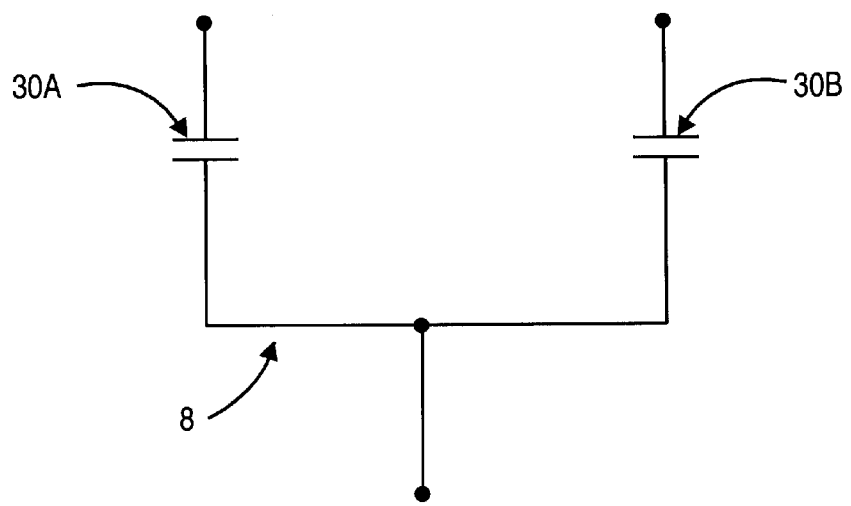
FIG. 5 is the electrical diagram of the capacitive structure shown in FIG. 4.

FIG. 5 is an electrical schematic of the capacitive structure 40 of FIG. 4. FIG. 5 shows upper electrodes 30A and 30B along with lower electrode 8.

We now turn to methods for forming thin film capacitors. The methods are described in more detail below. For one embodiment of the invention, the method starts with depositing an anodizable metal onto a substrate. The metal will become one electrode (i.e., terminal) of the capacitor. The metal layer is coated with photoresist. Photolithography is used to define an opening in the photoresist where the capacitor is to reside. The photoresist is hard baked at an elevated temperature. The exposed metal area is anodized using the photoresist as a mask. The photoresist is stripped, leaving an anodized layer over only a portion of the metal layer. A second metal layer is deposited over all existing features. Using photolithography, a pattern of photoresist is added over a portion of the second metal layer to define capacitor structures and bond pads. The next step is an etch step. The photoresist and the anodized layer each act as masks. The first and second metal layers outside of the perimeter of the capacitor structure are etched away in one step. The photoresist is removed, resulting in a thin film capacitor residing on a substrate. Subsequent processing steps can be used to form passivation layers and metal interconnects to capacitors and other active and passive components.

One alternative method for forming the thin film capacitor involves using a lift-off process to pattern the dielectric layer.

An intended advantage of certain methods described is to implement selective anodization using photoresist as an anodization mask while avoiding excessive lateral oxidation.

Another alternative method for forming the thin film capacitor involves depositing silicon nitride as the dielectric and then doing a subtractive etch.

An intended advantage of certain methods described for forming thin film capacitors is to provide for the formation of thin film capacitors on substrates that can also include other active and passive components.

An intended advantage of certain methods described is to provide cost-effective processing techniques for fabricating integrated capacitors having relatively high capacitance densities, relatively high breakdown voltages, and relatively tight tolerances.

Another intended advantage of certain methods described is to reduce the number of mask steps needed to fabricate a capacitor on a substrate.

Another intended advantage of certain methods described is to avoid having an anodized layer that has lateral overhang caused by undercutting during etching.

FIGS. 6–13 show one process flow for forming thin film capacitor 1.

Figure 6:
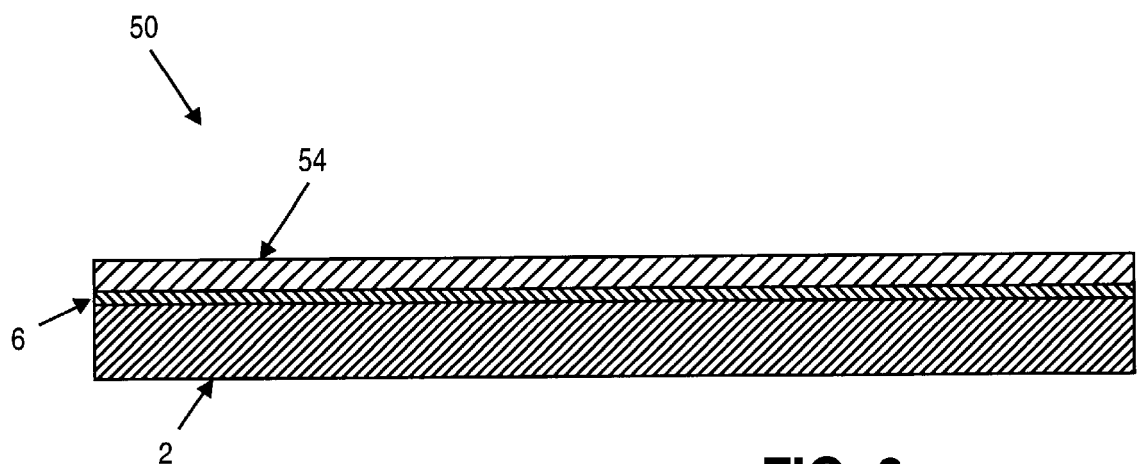
FIG. 6 shows a cross-section wherein an anodizable metal has been deposited on a substrate, which is a step in the process flow for forming a thin film capacitor.

FIG. 6 shows a cross-section 50. For one embodiment, substrate 2 is made of silicon. For one embodiment, layer 6 is an insulative layer that is an oxide silicon. This oxide of silicon layer 6 is produced by thermally treated silicon substrate 2 in the presence of oxygen.

For an alternative embodiment, substrate 2 is made of glass. For that alternative embodiment, there is no need for a separate insulative layer 6 given that the glass of the substrate 2 is an insulator.

For alternative embodiments of the invention, alternative materials can be used to form substrate 2. Examples of alternative materials for substrate 2 include ceramics, quartz, polymer-coated silicon wafers, and polymer-coated metals. Further examples of materials that can be used for substrate 2 are set forth above in the discussion of FIGS. 1–3.

Alternative materials that can be used for insulative layer 6 include, for example, a plastic such as polyimide, epoxy, or a ceramic.

The final choice among various options for materials for substrate 2 and insulative layer 6 can be dictated by cost, availability, and performance parameters, such as thermal conductivity and the electronic frequency used during the operation of the capacitor.

For one embodiment, a silicon wafer is used—for example, a 125 millimeter diameter silicon wafer. For an alternative embodiment that uses a glass substrate 2, a rectangular panel of glass is used as the substrate—for example, a glass panel approximately 350 millimeters by 400 millimeters. For other alternative embodiments, other types of substrates could be used, such a ceramic substrate or a 125 millimeter diameter wafer made of aluminium oxide.

For the embodiment using a silicon substrate 2, the silicon substrate 2 is oxidized to produce insulative layer 6. For one embodiment, oxidation is done in a tube furnace at a temperature between 800 degrees Centigrade and 1200 degrees Centigrade for approximately 2.5 hours. This produces an oxidation thickness of insulative layer 6 of about 8,000 angstroms.

An anodizable metal is then deposited onto the insulative layer 6 of substrate 2 to form metal layer 54, as shown in FIG. 6.

For one embodiment, the anodizable metal layer 54 is made of aluminum.

For another embodiment, the anodizable metal layer 54 is made of tantalum. For other embodiments, alloys of aluminum and tantalum can be used for metal layer 54. Alternative embodiments use other metals that are anodizable for metal layer 54, such as titanium, hafnium, zirconium, vanadium, niobium, molybdenum, tungsten, and the other metals and alloys discussed above in connection with the first conductive layer 9 of the embodiment shown in FIGS. 1–3.

For certain embodiments, the thickness of metal layer 54 may range from approximately 0.1 micrometer to 250 micrometers, although other thicknesses are possible. For certain embodiments, the metal layer 54 has a thickness of between of 1 and 5 micrometers.

For one embodiment, metal layer 54 is made of aluminum. In order to fabricate aluminum layer 54, a silicon wafer is sputtered with aluminum using a commercially available sputtering system. As one example, for a model 3190 sputtering system from Varian Corporation of Palo Alto, Calif., the sputtering conditions are as follows. The sputtering starts with in situ radio frequency ("RF") etching for approximately 50 seconds, followed by an aluminum deposition for approximately 71.4 seconds with a power of approximately 60%, which corresponds to a nominal thickness of aluminum layer 54 of approximately 1.25 microns.

For an alternative embodiment using a glass panel as substrate 2, the aluminum layer 54 can be formed using a Kurdex V3000 sputtering system from Kurdex Corporation of Fremont, Calif. For that alternative embodiment, the sputtering starts with in situ RF etching for approximately 120 seconds, followed by an aluminum deposition with the following conditions: Argon 100 sccm, 4,000 watts, scan speed of 82 mm/minute, and 1 mTorr. The glass panel is passed twice in order to have a nominal thickness of aluminum layer 54 of approximately 2.5 micrometers.

The next step is to clean the silicon wafer. Various methods can be used to clean the silicon wafer. For example, a spin rinse dryer can be used, such as one supplied by Semitool Inc. of Kalispell, Mont.

For an alternative embodiment not shown, an interlayer is formed over insulative layer 6 prior to the depositing anodized metal layer 54. In other words, the interlayer would reside between insulative layer 6 and metal layer 54. For that alternative embodiment, the interlayer could be used to form, for example, thin film devices such as resistors. The interlayer can be made of materials known in the art for making thin film resistors. Examples of interlayer materials include tantalum nitride ("Ta—N") nickel chromium ("Ni—Cr"), or a silicon chromium alloy ("Si—Cr"). The interlayer of tantalum nitride, for example, may be deposited using known techniques.

Besides an interlayer, other types of layers could be deposited between metal layer 54 and oxide layer 6, such as an adhesion layer (i.e., a stick layer) or a barrier layer.

For alternative embodiments of the invention, other techniques besides sputtering can be used to form the anodized aluminum layer 54. For example, the aluminum layer 54 could be electroplated or deposited by a physical vapor deposition of aluminum by evaporation.

Figure 7:
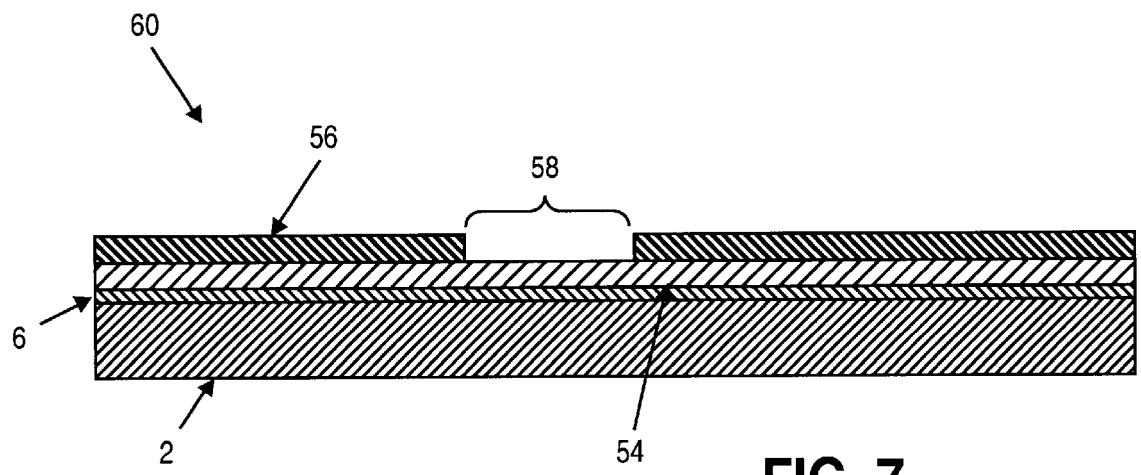
FIG. 7 shows a cross-section wherein an opening has been defined in the photoresist layer, which is a step in the process flow for forming the capacitor.

FIG. 7 shows cross-section 60, which helps to illustrate the next steps in the process flow for forming a thin film capacitor. Aluminum metal layer 54 is coated with photoresist layer 56. For one embodiment of the invention, a positive photoresist is used. In particular, for one embodiment of the invention, the positive photoresist is one of the AZ™ series of photoresists manufactured by Hoechst Celanese Corporation of Somerville, N.J. Alternative embodiments of the invention use other photoresist processes, including positive or negative photoresist processes. The thickness of the photoresist needs to be optimized to the specific process. If the photoresist is too thin, the photoresist will not have sufficient chemical resistance. If the photoresist is too thick, the precise pattern definition will be more difficult to achieve. For certain embodiments of the invention, photoresist thicknesses can range from about 1 micrometer to 10 micrometers, but other thicknesses are possible.

One embodiment of the invention does not deposit an adhesion promoter onto the surface of the anodizable aluminum layer 54 before depositing photoresist layer 56.

For alternative embodiments of the invention, however, an adhesion promoter is deposited on the aluminum layer 54 before the photoresist layer 56 is deposited. For one embodiment of the invention, the adhesion promoter is deposited in the vapor phase. For another embodiment of the invention, the adhesion promoter is deposited as an aqueous dispersion.

For the alternative embodiment of the invention that uses a vapor phase adhesion promoter, a YES-5 vacuum prime oven manufactured Yield Engineering Systems, Inc. of San Jose, Calif. can be used for the adhesion promoter process. For that alternative process, the wafers or panels are subjected to a dehydration bake in the YES-5 vacuum prime oven at 150 degrees Centigrade under an active vacuum of approximately less than 1 torr for approximately 1 hour. Next, hexamethyl disilazane ("HMDS") is introduced into the chamber of the vacuum prime oven for approximately five minutes with a background pressure of approximately 1 torr. The pressure with the HMDS present is approximately 6 torr.

For other alternative embodiments of the invention, other methods of applying adhesion promoters can be employed.

Regardless of whether or not an adhesion promoter is used in the process flow for making a capacitor, the next step is depositing the photoresist on aluminum layer 54. For one embodiment of the invention, a photoresist layer 56 is deposited by spin coating. In particular, the wafers are coated with a positive photoresist AZ-4330 supplied by Hoechst Celanese Corporation of Somerville, N.J. on a SVG 8600 spin coater supplied by the Silicon Valley Group of San Jose, Calif. For one embodiment of the invention, the resulting photoresist layer 56 is approximately 3.7 micrometers thick plus or minus 0.1 micrometers. Other thicknesses, however, are possible.

For the alternative embodiment using a glass panel as a substrate, the glass panel is coated with a positive photoresist AZ-4330 on a FSI FP-BGBCD spin coater supplied by FSI International, Inc. of Chaska, Minn.

For alternative embodiments of the invention, other techniques for coating photoresist to wafers or panels are employed, including techniques such as spray coating, meniscus coating, or extrusion coating. Those alternative techniques may be better suited for covering larger substrates.

For one embodiment, the photoresist layer 56 is then soft baked. Soft baking accomplishes several purposes, including driving off solvent from the spun-on resist, improving the adhesion of the resist, and annealing the stresses caused by the shear forces encountered in the spinning process. The soft bake temperature must be such that the photoresist is heated to remove a portion of the solvent in the photoresist but not to such a high temperature that the photoresist will polymerize. For one embodiment of the invention, the wafers are automatically transferred to a hot plate for soft baking at approximately 110 degrees Centigrade for approximately 2 minutes.

Photolithography is next used to define in photoresist layer 56 an opening 58 where the thin film capacitor is to be formed. The wafer is exposed to light through a mask, and a pattern developed using developers specific to the type of photoresist used. For alternative embodiments, other types of electromagnetic energy besides light is used in the photolithography process, including X-rays.

For one embodiment of the invention, the patterning of the wafers is accomplished using a PLA-501FA proximity mask aligner sold by Canon, Inc. of Tokyo, Japan. For the first layer alignment and exposure, the wafers are automatically cycled through the aligner. The exposure (Light Integral) is approximately 250 milliJoules. The pattern is developed in a 4 to 1 mixture of water and the developer AZ 400K supplied by Hoechst Celanese Corporation of Somerville, N.J. For other embodiments of the invention, other developers can be used. For example, alkaline water solutions (e.g., sodium or potassium hydroxide and water) and non-ionic aqueous solutions (e.g., tetramethyl ammonium hydroxide and water) are commonly used for positive photoresist. Xylene can be used for a negative photoresist process, for example.

For the alternative embodiment using a glass panel as the substrate, the patterning of the panel is done with a MRS 5001-HT stepper supplied by MRS Technology, Inc. of Chelmsford, Mass.

For an alternative embodiment of the invention, photoresist is not used. Instead, a photo imageable polymer mask is used in order to form opening 58.

The next step in the process flow is to hard bake the photoresist layer 56 at a proper set of conditions of time and temperature so that the photoresist adhesion is sufficient to allow anodization to take place, yet the adhesion is weak enough to permit removal of the photoresist layer 56 later in the process flow. It has been surprisingly discovered that under baking conditions that generally cause the photoresist layer 56 to be insoluble (i.e., essentially impossible to remove without damaging the conductive layer 54 or substrate 2) could under appropriate anodizing conditions again become soluble enough to be removed without damaging the conductive layer 54, substrate 2, or anodized dielectric layer 16.

In other words, the conditions used for the optimum hard bake for the present process flow are very different from those used for most other prior art processes, and in fact correspond to temperatures that the prior art recommends for permanent photoresist coatings. That is, the photoresist layer 56 is baked to a temperature where the photoresist layer 56 becomes essentially insoluble in a stripper. Essentially insoluble is when the photoresist 56 cannot be removed or is only removed with difficulty, causing substantial damage to the metal layer 54 or opening 58. Substantial damage can include pin holes within the metal surface 56 or undercutting of the metal surface 56, such that a defective capacitor may result.

Surprisingly, however, the process flow of the present invention allows anodization without lift-off or cracking of the photoresist layer 56. For the embodiment of the present invention, even though the photoresist layer 56 is hard baked under conditions recommended for permanent coatings, the photoresist nevertheless can be stripped using conventional organic based strippers.

The preferred hard bake for photoresist layer 56 is the minimum temperature required to successfully anodize the wafers or panels without incurring lift-off or cracking in the photoresist layer 56. In particular, for the AZ-4330 photoresist, the hard bake temperature is approximately between 170 degrees Centigrade and 220 degrees Centigrade for approximately at least 30 minutes plus or minus five minutes. The preferred temperature is approximately 190 degrees. The hard baking occurs in a Blue M® electric oven supplied by SPX Corporation of Muskegon, Mich.

This hard bake temperature of approximately 190 degrees is to be contrasted with the common prior art baking temperature of approximately 125 degrees Centigrade. Using the prior art baking temperature can sometimes lead to substantial defects in the underlying structure.

Alternative hard bake conditions are possible. The proper hard bake conditions are expected to be somewhat dependant on the specific photoresist used in the process flow. Generally, the hard bake should occur at higher temperatures than recommended for non-permanent coatings in the prior art bulletin of the manufacturer of the photoresist.

For one embodiment of the invention, the hard baking occurs in an air environment. For alternative embodiments, however, hard baking can occur in is other environments, such as in a vacuum or in inert atmospheres, such as a noble gas or nitrogen.

As a next optional step in the process flow, a plasma cleaning process can be employed to de-scum the wafers. In particular, an oxygen plasma clean can be carried out in a Branson-IPC® plasma barrel chamber supplied by Branson Ultrasonics Corp. of Danbury, Conn. with a power of approximately 1,000 watts, a pressure of approximately 1.5 torr, and a duration of approximately 20 minutes.

For the alternative embodiment that uses a glass panel as a substrate, the plasma cleaning process can be done in a Kurdex ST-330 RF plasma ashing system supplied by Kurdex Corporation of Sunnyvale, Calif. An example of the parameters can be an oxygen flow rate of approximately 800 sccm, a power of approximately 1,200 watts, a pressure of approximately 1.2 Torr, and a duration of approximately 600 seconds.

Figure 8:
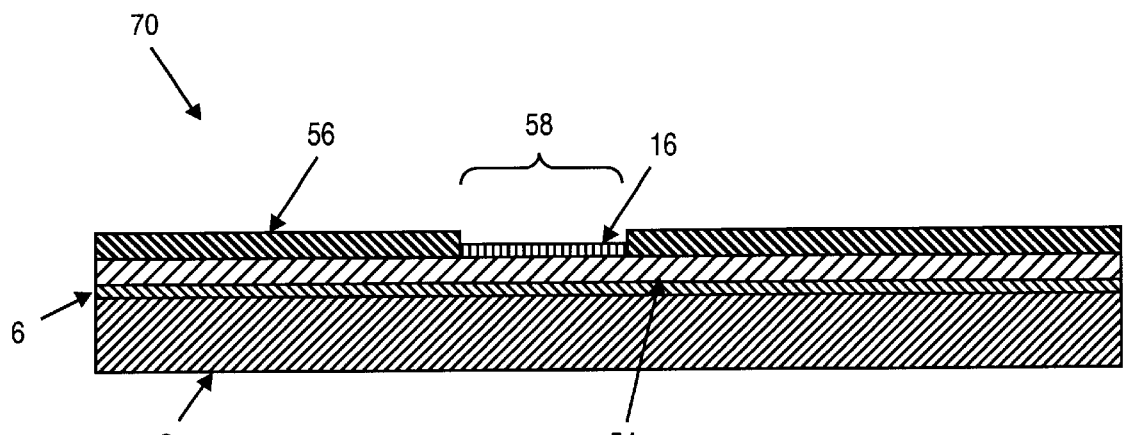
FIG. 8 shows a cross-section wherein a dielectric has been formed by an additive anodization, which is a step in the process flow for forming the capacitor.
Figure 9:
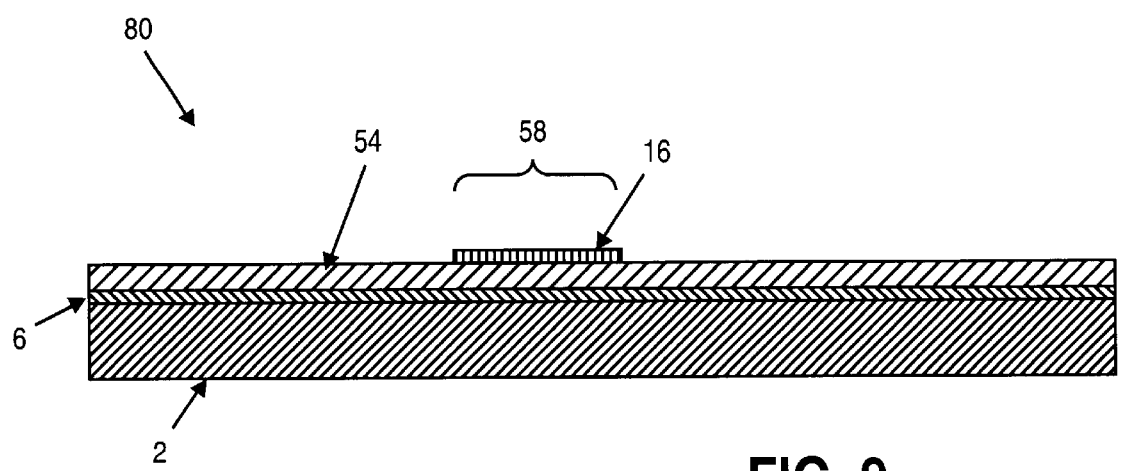
FIG. 9 shows a cross-section wherein the photoresist has been stripped, which is a step in the process flow for forming the capacitor.

As the next step in the process flow, the wafers are anodized to produce a layer 16 of aluminum oxide $Al_2O_3$ shown in cross-section 70 of FIG. 8. An example of an anodization process is as follows. Anodization occurs by applying to the top of the wafer or panel a mixture of ammonium pentaborate in an ethylene glycol solution with the ammonium pentaborate comprising approximately 19% of the solution. The pH of the solution is maintained between approximately 5.0 and 5.5. The temperature of the solution is approximately 18 degrees Centigrade to 26 degrees Centigrade. The anodization parameters comprise a forming voltage in the range of approximately 110 to 130 volts, a current density of approximately 0.55 $mA/cm^2$, and a total ionization time of approximately twenty minutes. The thickness of the anodized aluminum layer 16 is approximately 0.17 micrometers to 0.2 micrometers. This process thus uses a non-aqueous formulation for anodization. The non-aqueous formulation for anodization gives a pinhole free layer 16 of aluminum oxide.

Varying the forming voltage will result in a capacitor with a different density and a different breakdown voltage. For alternative embodiments, other anodization methods can be used, including other available solutions used for anodization.

As shown in FIG. 8, the photoresist layer 56 protects the regions of the wafer or panel where anodization is not desired—i.e., the areas outside of opening 58. Because of the prior hard baking step, no substantial cracking or lift-off of the photoresist layer 56 occurs during anodization. For alternative embodiments, a layer of silicon dioxide or silicon nitride may be placed over the aluminum oxide $Al_2O_3$ layer 16 to further improve the pinhole free properties of layer 16.

The anodization process not only produces anodized dielectric layer 16, the anodization process also causes the hard baked photoresist 56 to be soluble enough in a stripper so that the photoresist may be stripped. During the anodization process, the photoresist layer 56 is exposed to the anodization solution. During anodization, the exposed portion of metal layer 54 within area 58 becomes anodized to aluminum oxide. Meanwhile, the photoresist layer 56 protects the portions of metal layer 54 covered by photoresist layer 56. Surprisingly, the anodization process causes the photoresist layer 56 to be soluble enough to be removed with a stripper.

After anodization, the photoresist layer 56 is stripped using a stripper. The result is shown by the cross-section 80 shown in FIG. 9. After stripping, no photoresist resides above metal layer 56 and only the anodized dielectric layer 16 resides above metal layer 56 shown in FIG. 9. Dielectric layer 16 is also referred to as dielectric element 16.

As described above, the hard baking process described above allows the photoresist layer 56 to be stripped even though the hard baking also makes the photoresist robust enough to withstand anodization. The anodization process weakens the photoresist layer 56 sufficiently so that the photoresist layer can be stripped. In order to strip the photoresist layer 56, the wafers or panels are immersed in a mixture of 2-(2 Aminoethoxy) ethanol and N-Methylpyrrolidone supplied by EKC Corporation of Hayward, Calif. under the trade name Posistrip® 830. For one embodiment, immersion lasts for approximately 40 minutes in order to strip the photoresist layer 56. For other alternative embodiments, other strippers are used to strip photoresist layer 56. For example, one of the alternative strippers is ST44 supplied by ACSI of Milpitas, Calif. The particular strippers employed may depend, for example, on whether the photoresist layer 56 is a negative photoresist or a positive photoresist and may also depend on the type of metal deposited as metal layer 54 and the type of anodized oxide formed as dielectric layer 16. Further examples of alternative strippers include other alkaline aqueous solutions, non-ionic solutions, organic strippers (such as sulfonic acid in a chlorinated solvent, such as those available under the trade name Nophenol™ from EKC Technology, Inc. of Hayward, Calif.), and chromic sulfuric acid mixtures. The Posistrip® 830 stripper mentioned above is a solvent stripper.

As a next optional step in the process flow, a plasma cleaning process can be employed. The plasma cleaning process uses oxygen in order to assist the removal of any photoresist residue that may be residing on top of metal layer 54 and anodized oxide layer 16. In particular, an oxygen plasma clean can be carried out in a Branson-IPC® plasma barrel chamber supplied by Branson Ultrasonics Corp. of Danbury, Conn. with a power of approximately 1000 watts, a pressure of approximately 1.5 torr, and a time of approximately 20 minutes in order to remove any residual traces of photoresist layer 56.

For the alternative embodiment using a glass panel as the substrate, the plasma cleaning process can be done in a Kurdex ST-330 RF plasma ashing system supplied by Kurdex Corporation of Sunnyvale, Calif. The parameters that can be used are an oxygen flow rate of 800 sccm, a power of approximately 1,200 watts, a pressure of approximately 1.2 Torr, and a duration of approximately 600 seconds.

The next step in the process flow is to perform a radio frequency ("RF") etch on the top of the wafer to clean the top surface of metal layer 54 and anodization layer 16. The RF etch cleans metal layer 54 and dielectric layer 16, but the RF etch does remove a small amount of the anodization layer 16. For one embodiment, the dielectric layer is approximately 1,500 angstroms in thickness. The RF etch typically removes approximately 40 to 50 angstroms of materials on top of the dielectric layer 16. An alternative method of cleaning is to use ion beam bombardment.

For one embodiment, the RF etch is done in a sputtering machine that uses argon ions in an RF plasma to bombard the metal layer 54 and dielectric layer 16. The sputtering machine is calibrated based on a known thickness of the aluminum oxide layer 16. For one embodiment, the RF etch typically takes approximately 1 to 2 minutes. For one embodiment, the sputtering machine is a model 3190 sputtering system from Varian Corporation of Palo Alto, Calif. For alternative embodiments, other types of RF etches and other types of processes to remove material may be used to clean aluminum layer 54 and dielectric layer 16.

Figure 10:
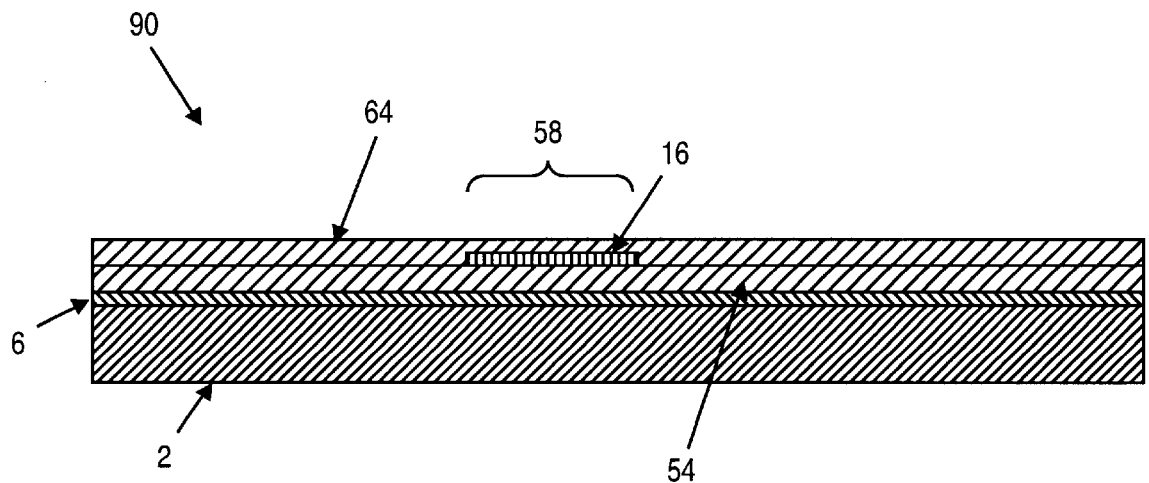
FIG. 10 shows a cross-section wherein a second metal layer has been deposited to cover the existing features, which is a step in the process flow for forming the capacitor.

As shown by cross-section 90 in FIG. 10, the next step in the process flow is to deposit another conductive layer 64 on top of metal layer 54 and dielectric layer 16. For one embodiment of the invention, the second conductive layer 64 is aluminum. For an alternative embodiment, the second conductive layer 64 may be any conductive metal that exhibits sufficient adhesion to anodized aluminum. Examples of metals that can be used for second conductive layer 64 include aluminum alloy, copper, and gold. For alternative embodiments, the same types of metal can be used for metal layer 64 as the types of metal that could be used for metal layer 54.

The metal used for metal layer 64 need not be the same metal used for metal layer 54. For one embodiment, however, the same metal is used in layer 64 as used in layer 54. For one embodiment, aluminum is used for metal both layers 54 and 64.

For alternative embodiments, a separate adhesion layer is deposited on first conductive metal layer 54 before the second conductive layer 64 is deposited. For that alternative embodiment, the separate adhesion layer helps to adhere the second metal layer 64 to the first metal layer 54. For that alternative embodiment, the adhesive layer would either need to be conductive or removable as part of the process flow.

The thickness of the metal layer 64 deposited depends upon the metal and is controlled by the desired electrical performance (i.e., the series resistance) of the capacitor.

For one embodiment of the present invention, the aluminum layer 64 is deposited by a sputtering process using aluminum in a model 3190 sputtering system of Varian Corporation of Palo Alto, Calif. The sputtering condition used is an in situ RF etch for approximately 20 seconds, followed by aluminum deposition for approximately 57.1 seconds, with a power of approximately 60%, which results in a nominal thickness of the metal layer 64 of approximately 1 micrometer.

For the alternative embodiment using a glass panel as the substrate, the aluminum layer 64 is deposited by a sputter process using aluminum in a Kurdex V3000 sputtering system supplied by Kurdex Corporation of Sunnyvale, Calif. The sputtering starts with in situ RF etching for approximately 120 seconds, followed by aluminum deposition with the following conditions: Argon 100 sccm, 4,000 watts, scan speed of 82 mm/min., and 1 mmTorr. This results in a nominal thickness of aluminum layer 64 of approximately 1.25 micrometers.

By not etching away the portion of layer 54 not residing under area 58, the described technique avoids an additional mask step. In other words, the described technique deposits metal layer 64 without first etching away any portion of metal layer 54. Because of this, an additional mask step is avoided. That additional mask step would have comprised covering area 58 with photoresist, then etching away the portion of layer 54 not under the photoresist, removing the photoresist over area 58, and then applying a metal layer over dielectric layer 16. The process of applying metal layer 64 over metal layer 54 avoids this additional masking step.

Figure 11:
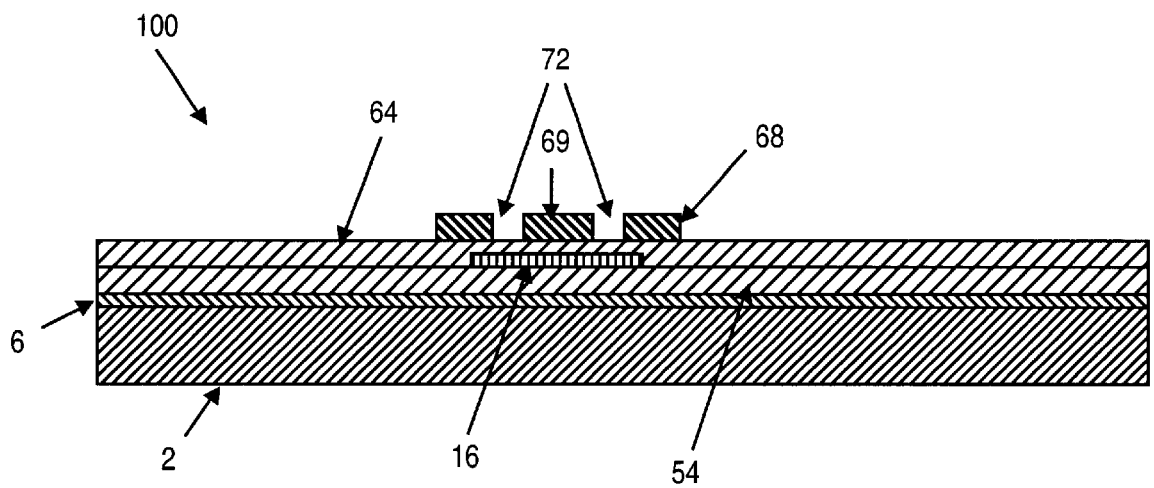
FIG. 11 shows a cross-section wherein photolithography has been used to form a layer of photoresist over the second metal layer, which is a step in the process flow for forming the capacitor.

As shown by cross-section 100 in FIG. 11, the next steps in the process flow involve depositing photoresist layer 68 on top metal layer 64. The process for depositing photoresist layer 68 is as follows for one embodiment. The wafers are subjected a dehydration bake at approximately 150 degrees Centigrade under an active vacuum of approximately of less than 1 Torr for approximately 1 hour. Then HMDS is introduced into the chamber for approximately 5 minutes. The background pressure is approximately 1 Torr. The pressure with HMDS present is approximately 6 Torr. The wafers or panels are then coated with a positive photoresist AZ-4330 on a SVG 8600 spin coater supplied by the Silicon Valley Group of San Jose, Calif. The resulting thickness of photoresist layer 68 is approximately 3.7 micrometers plus or minus 0.1 micrometers. The wafers or panels are then automatically transferred to a hot plate for soft baking at approximately 110 degrees Centigrade for approximately 2 minutes.

The wafers are then patterned to create opening 72 in photoresist layer 68. Opening 72 creates a central area 69 of photoresist that is completely surrounded by opening 72. Opening 72 extends from the top of the photoresist layer 68 to the metal layer 64. For one embodiment of the invention, the patterning of the wafer or panel is accomplished using a Canon PLA-501FA proximity mask aligner sold by Canon, Inc. of Tokyo, Japan. For the first layer alignment and exposure, the wafer or panel is automatically cycled through the aligner. The exposure (light Integral) is approximately 250 milliJoules. The pattern is developed in a 4 to 1 mixture of water and the developer AZ 400K supplied by Hoechst Celanese Corporation of Somerville, N.J.

For the alternative embodiment using a glass panel as the substrate, the patterning of the panel is done with a MRS 5001-HT stepper supplied by MRS Technology, Inc. of Chelmsford, Mass.

The next step in the process flow is to hard bake the wafer at a normal non-elevated hard bake temperature of approximately 125 degrees Centigrade for approximately 30 minutes. Following the hard baking, the wafer or panel is de-scummed in a Branson IPC® plasma barrel chamber supplied by Branson Ultrasonics Corp. of Danbury, Conn. for approximately seven minutes with a power level of 250 watts and a pressure of approximately 1.5 torr.

For the alternative embodiment using a glass panel as the substrate, the de-summing step can take place in a Kurdex ST-330 RF plasma ashing system with an oxygen flow rate of approximately 800 sccm, a power of approximately 1,200 watts, a pressure of approximately 1.2 Torr, and a duration of approximately 600 seconds.

Figure 12:
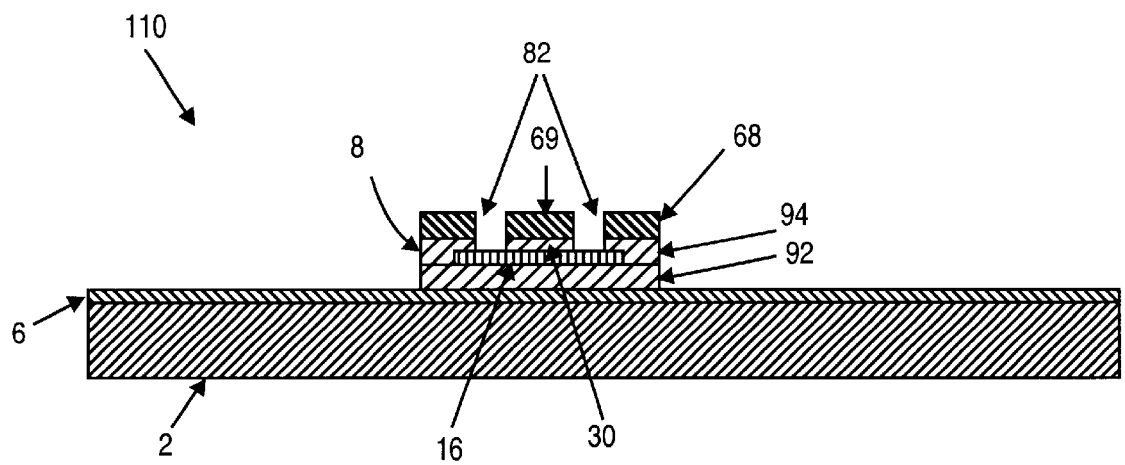
FIG. 12 shows a cross-section wherein the metal not covered by the photoresist or the dielectric element has been etched, which is a step in the process flow for forming the capacitor.

The next step in the process flow is shown by cross-section 110 in FIG. 12. The wafer is etched. Both the photoresist layer 68 and the dielectric layer 16 act as etch stops, preventing the etchant from penetrating the respective metal beneath those etch stops. The configuration of the structure shown in FIG. 12 means that it is possible to perform a one step etch rather than a two step etch given that the both photoresist layer 68 and the dielectric layer 16 act as etch stops. For the etch step, the portions of metal layers 64 and 54 shown in FIG. 11 that reside outside of the area covered by either photoresist layer 68 or dielectric layer 16 are etched away by the etchant, leaving layer 94 in place of layer 64 and leaving layer 92 in place of layer 54. In addition, the etchant enters area 72 shown in FIG. 11 and etches away the portions of metal layer 64 under area 72, forming opening 82 shown in FIG. 12. Opening 82 extends down to dielectric layer 16. Area 82 thus isolates photoresist area 69 and also creates the isolated upper conductive region 30, also referred to as terminal 30.

The result of this etch step is that first terminal 8 is formed, which comprises metal layers 92 and 94. In addition, terminal 30 is formed above dielectric region 16. Areas 8, 30, 94, and 92 are all made of aluminum.

The aluminum etching step described above is carried out in a solution that contains acetic acid, nitric acid, and phosphoric acid. The solution temperature is controlled to be approximately 40 degrees Centigrade plus or minus two degrees Centigrade. The etching time is approximately 11 minutes.

For alternative embodiments of the invention, other etchants can be used. For example, if metal layer 64 was made of a different material than metal layer 54, one would probably use two etchants rather than one etchant in order to remove the portions of both metal layers 64 and 54 residing outside of the region covered by photoresist layer 68 and dielectric layer 16. If metal layer 64 was made of a different material than metal layer 54, two etchants could be used that have opposite selectivity ratios. Using two different etchants means that there would be two steps for applying the two etchants.

The next step in the process flow is to strip the photoresist layer 68, including central area of photoresist 69. For one embodiment, the photoresist layer 68 and photoresist area 69 are stripped in Posistrip® at approximately 90 degrees Centigrade plus or minus 2 degrees Centigrade for approximately 20 minutes. The resulting structure after the stripping is shown as cross-section 120 in FIG. 13.

Figure 13:
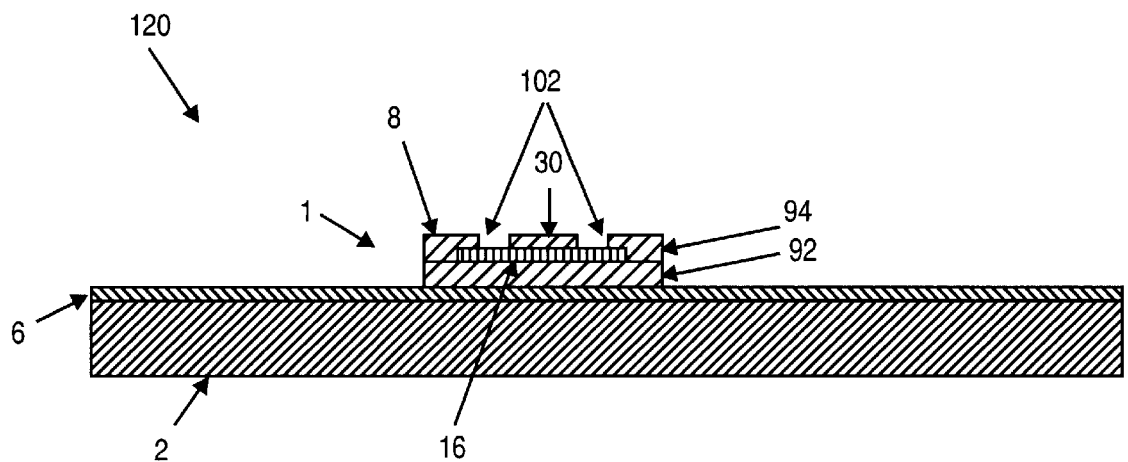
FIG. 13 shows a cross-section wherein the photoresist has been stripped resulting in a capacitor residing on the substrate, which is a step in the process flow for forming the capacitor.

The stripping of photoresist layer 68 results in a thin film capacitor 1, as shown as cross-section 120 in FIG. 13. The capacitor 1 has a first terminal 8 made up of metal layers 92 and 94. Metal layer 94 resides on top of metal layer 92. The second terminal 30 of capacitor 1 resides on top of dielectric layer 16. Opening 102 separates the second terminal 30 from the first terminal 8. As shown in FIG. 13, the capacitor 1 resides on top of oxide layer 6 above substrate 2.

The process flow for forming capacitor 1 can be used to fabricate a large variety of sizes of capacitors. For example, possible (square) capacitor sizes include 100 micrometers by 100 micrometers, 1,000 micrometers by 1,000 micrometers, and 10,000 micrometers by 10,000 micrometers. Examples of capacitor values that correspond to those capacitors are five picofarads, five hundred picofarads, and fifty nanofarads, respectively, based on a nominal capacitance density of fifty nanofarads per square centimeter. The capacitance value depends on a number of factors, however, including the size of the capacitor, the thickness of the dielectric layer 16, and the size of the second terminal 30.

After capacitor 1 is formed, it can be checked for mechanical tolerances and also checked for electrical parameters. Different-sized capacitors may have different capacitance values and different breakdown voltage values.

For alternative embodiments of the invention, the process flow described can be altered to produce other electronic devices having an anodized dielectric layer, such as a resistor, a Josephson junction transistor, or an inductor.

Figure 14:
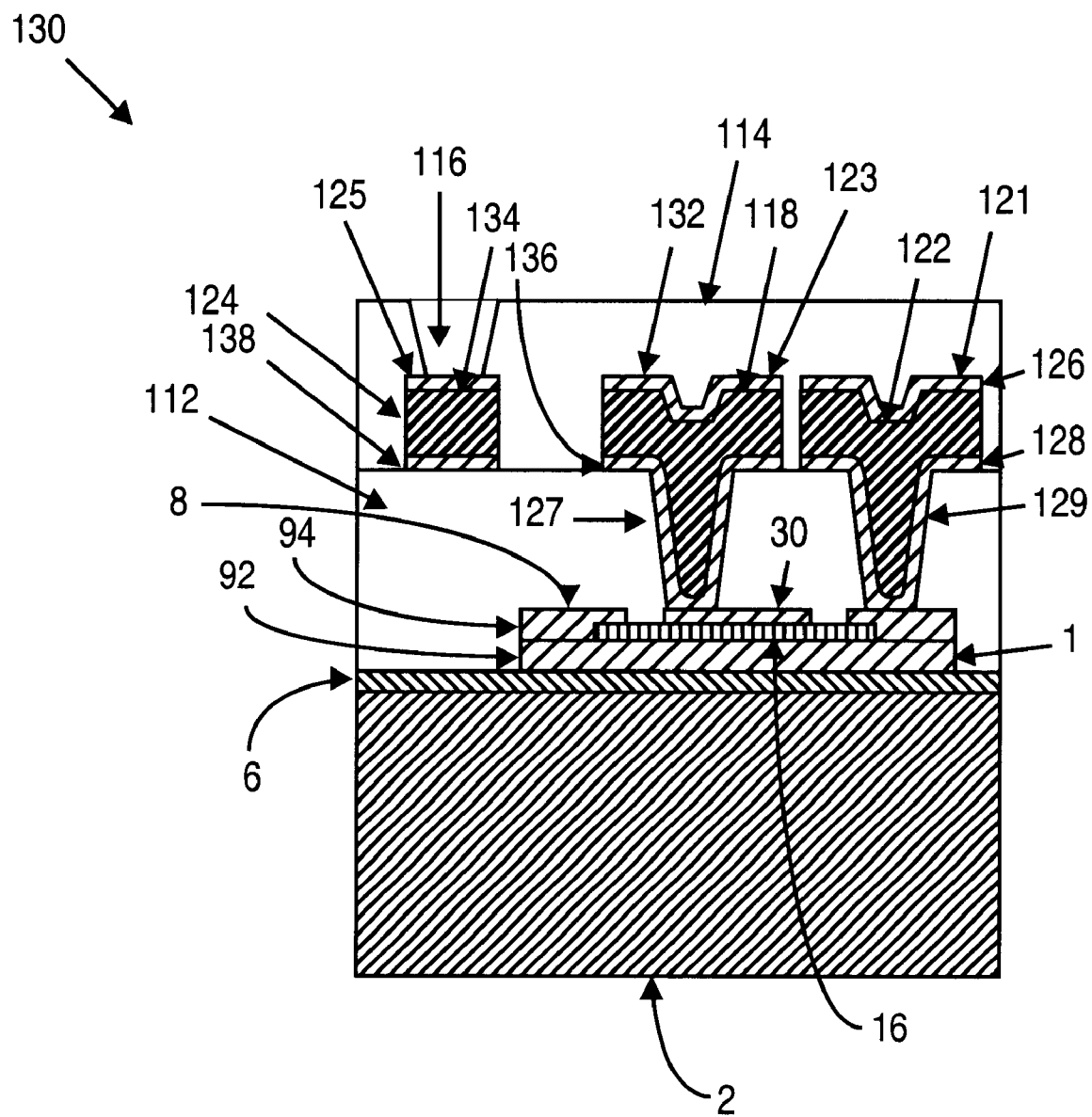
FIG. 14 is a cross-section of an integrated capacitor in a multilayer structure.

FIG. 14 shows the incorporation of thin film capacitor 1 into an integrated circuit structure that includes an interlayer dielectric layer 112 and a passivation layer 114. FIG. 14 shows a cross-section 130 of the integrated circuit structure mounted on substrate 2 and oxide layer 6.

Metal interconnect structures 121 and 123 provide a connection to capacitor 1. In particular, metal interconnect structure 121 connects to the first terminal 8 of capacitor 1. The metal interconnect structure 123 connects to second terminal 30 of capacitor 1. For one embodiment, the metal interconnect structure 121 includes a metal layer 128 that lines via 129. For one embodiment, the metal layer 128 is made of tantalum nitride ("Ta—N"). The metal interconnecting structure 121 also includes a copper layer 122 that fills the via 129 and provides an interconnecting structure within passivation layer 114. The metal interconnecting structure 121 also includes a top layer 126 made of aluminum or nickel, for example.

Metal interconnecting structure 123 similarly includes a layer 127 made of tantalum nitride, a copper layer 118, and an upper layer 132 made of aluminum or nickel, for example. The portions of interconnecting structure 121 and 123 within passivation layer 114 provide interconnecting metal paths to other active or passive components within the integrated circuit.

Cross-section 130 also shows a via 116 with a metal interconnecting structure 125 having a first layer 138 comprised of tantalum nitride, a middle layer 124 comprised of copper, and a upper layer 134 made of aluminum or nickel, for example. Metal interconnecting structure 125 is used to provide an interconnection to other active and passive components within the integrated circuit. Via 116 also provides an opening to the outside for external connections to interconnecting structure 125.

The formation of interlayer dielectric layer 112, passivation layer 114, vias 116, 127, and 129, and metal interconnecting structures 125, 121, and 123 can be done using common integrated circuit fabrication techniques.

The interlayer dielectric layer 112 can be formed from silicon dioxide, boron phosphate silicate glass ("BPSG"), polyimides, benzocyclobutene, epoxy, or other materials. Passivation layer 114 can be made from a variety of different materials, including silicon nitride, silicon dioxide, polyimides, or epoxy.

Vias 116, 121, and 123 can be created by conventional techniques such as photoimaging, etching, or laser ablation.

For alternative embodiments in the invention, other materials can be used for interconnecting structures 121, 123, and 125. For example, aluminum or tantalum can be used for middle layers 124, 118, and 122 of the respective interconnecting structures 125, 123, and 121. Other types of metals can be used to line the vias 116, 127, and 129 and also to cover the interconnecting structures 125, 121, and 123.

One the advantages of the embodiments of the present invention is that the interconnection to capacitor 1 by interconnect structures 121 and 123 can be done within the same plane of dielectric layer 112. In other words, vias 127 and 129 connect to the upper surface of thin film capacitor 1.

For alternative embodiments, however, connections can be made to the underside of capacitor 1 in order to connect to the first terminal 8.

The interconnecting structures 125, 121, and 123 can be patterned using conventional techniques to provide traces and interconnections to other active and passive components within the integrated circuit. For alternative embodiments of the present invention, additional interlayer dielectric layers and passivation layers can be formed. In other words, there can be more than one dielectric layer 112 and more than one passivation layer 114. Moreover, more complex interconnecting structures can be formed that connect several layers to form complex integrated circuits. Vias can be used to help to interconnect between the various layers. Various thin film capacitors can be formed within various layers to provide a more complex structure.

The interlayer dielectric layer 112 and the passivation layer 114 serve to cover and protect thin film capacitor 1 and also cover and protect the interconnection components 125, 123, and 121 to provide a more robust structure for holding capacitor 1.

For an alternative embodiment of the invention, capacitor 1 could be fabricated to be part of a silicon interconnect substrate ("SIS").

For the cross-section 130 of FIG. 14, dielectric layer 112 can be formed from a polymer that is spun on. The dielectric layer 112 formed from a polymer is then patterned to create vias 127 and 129. The surfaces of the vias 127 and 129 are then metalized by using a sputtering technique. The sputtering technique then forms layer 136 for interconnect layer 123 and layer 128 for interconnect layer 121. For one embodiment, tantalum nitride is used to form metal layers 136 and 128. For an alternative embodiment, titanium is used to form metal layers 136 and 128.

After sputtering, the thicker layers 118 and 122 of copper are applied by electroplating. Aluminum or nickel layers 132 and 126 are then deposited on top of the respective copper layers 118 and 122.

For one embodiment of the invention, dielectric layer 16 of capacitor 1 shown in FIG. 13 in cross-section 120 is an aluminum oxide anodized layer. For an alternative embodiment, dielectric layer 16 can be formed from a deposited layer of silicon nitride. One advantage of using aluminum oxide for dielectric layer 16 is, however, the fact that aluminum oxide is harder to etch and therefore provides a more permanent structure that is less likely to be etched away during the fabrication process. Silicon nitride, in contrast, is easier to etch. Nevertheless, silicon nitride has a higher breakdown voltage than aluminum oxide. On the other hand, aluminum oxide has a better dielectric in terms of capacitance density. The dielectric layer 16 can be approximately one fifth thicker if one uses aluminum oxide instead of silicon nitride.

For an alternative embodiment, tantalum oxide is used for dielectric layer 16. Tantalum oxide is even better than aluminum in terms of dielectric density. Nevertheless, tantalum oxide is more expensive than aluminum oxide.

For an alternative embodiment of the invention, instead of forming the anodization layer 16 using a mixture of ammonium pentaborate in an ethylene glycol solution, aluminum oxide can instead be sputtered to form dielectric layer 16. In other words, instead of using a solution to form dielectric layer 16, aluminum oxide can be sputtered onto metal layer 54 in order to form dielectric layer 16.

Figure 15:
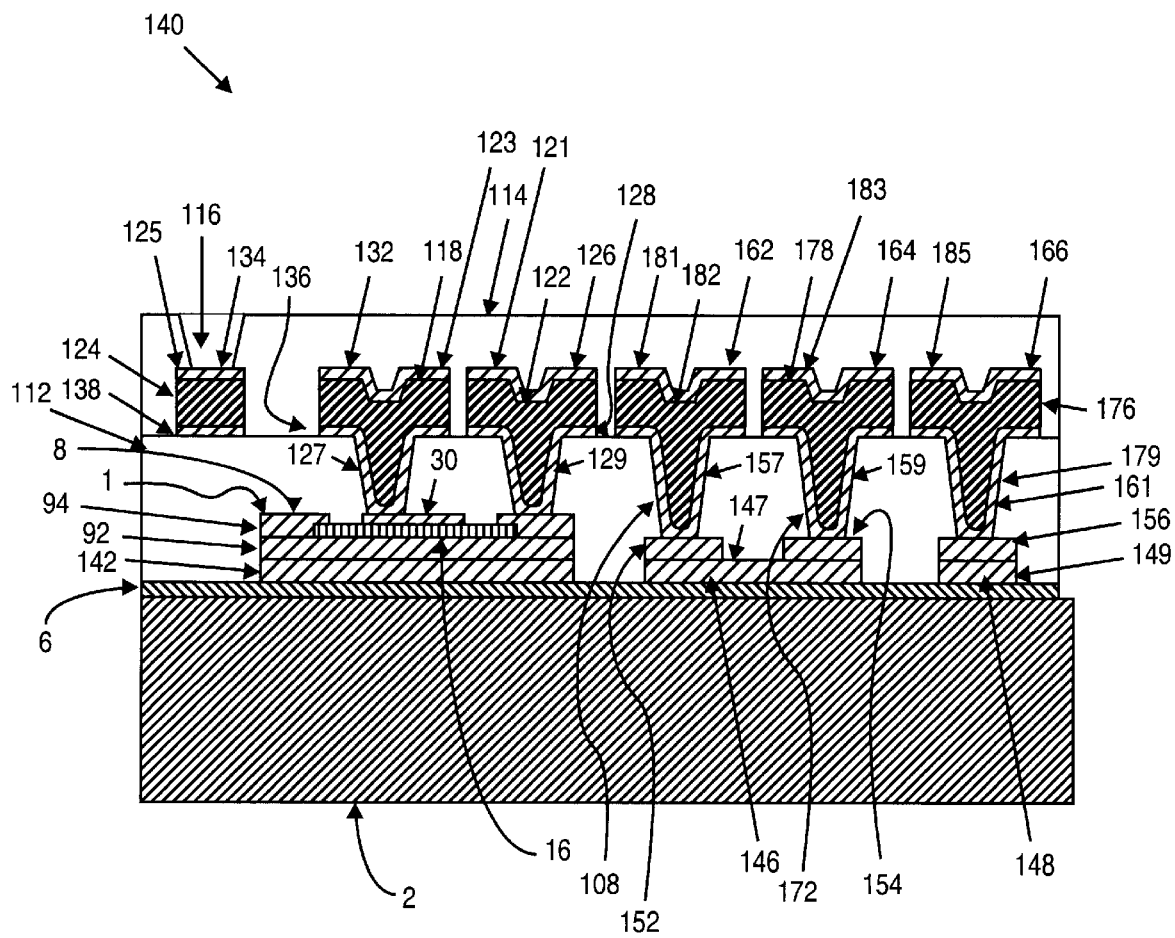
FIG. 15 is a cross-section of an integrated capacitor, an integrated resistor, and an integrated inductor in a multilayer structure.

FIG. 15 shows an alternative cross-section 140 that includes interlayers 142, 146, and 148. Interlayers 142, 146, and 148 are used to form other devices within the integrated circuit cross-section 140 shown in FIG. 15.

For one embodiment of the invention, interlayers 142, 146, and 148 are deposited before metal layers 92, 152, 154, and 156 are sputtered and deposited. Interlayers 142, 146, and 148 can be made from various materials. For example, interlayers 142, 146, and 148 can be made from tantalum nitride ("TaN") or a mixture thereof.

The use of interlayer 142, 146, and 148 allows the fabrication of other components, such as resistors and inductors, at the same time that capacitor 1 is being formed. As shown in cross-section 140 in FIG. 15, resistor 147 is one the components fabricated at the same time that capacitor 1 is fabricated. Resistor 147 comprises an interlayer 146 covered by metal layers 152 and 154. Layers 152, 154, and 146 are configured to form a resistor structure. Interconnecting structure 181 is used to connect to one side of the resistor 147 at layer 152, while interconnecting structure 183 is used to connect to the other side is of resistor 147 at metal layer 154.

For one embodiment of the invention, metal layers 152 and 154 are comprised of aluminum. For alternative embodiments of the invention, however, metal layers 152 and 154 can be made of the types of materials used to form metal layers 92 and 94 of capacitor 1.

Interconnect structure 181 includes a bottom metal layer 108, a middle metal layer 182, and an upper metal layer 162. Interconnect structure 183 includes a lower metal layer 172, a middle metal layer 178, and an upper metal layer 164. Layers 108 and 172 can be made of the same materials as layers 136 and 128 of respective interconnecting structures 123 and 121. Metal layers 182 and 178 can likewise be made of the same materials as that can be used for metal layers 118 and 122 of respective interconnecting structures 123 and 121. In addition, metal layers 181 and 183 can be made of the same materials as respective upper layers 132 and 126 of interconnecting structures 123 and 121.

Interlayer 148 and metal layer 156 can be used to form inductor 149. Metal layer 156 can be made out of the types of materials used to make layers 92 and 94 of capacitor 1.

Electrical interconnecting structure 185 is used to contact layer 156 of inductor 149. Electrical interconnecting structure 185 is made of metal layers 179, 176, and 166. Metal layer 166 can be made out of the same materials as respective metal layers 132 and 126 of interconnecting structures 121 and 123. Metal layer 176 can be made out of the same types of materials as layers 118 and 122 of respective electrical interconnecting structures 123 and 121. Similarly, layer 179 can be made of the same types of materials as layers 136 and 128 of electrical interconnecting structures 123 and 121.

Electrical interconnecting structures 181, 183, and 185 provide connections to other circuitry and devices within the integrated circuit.

Vias 157, 159, and 161 can be formed in the same manner as vias 127 and 129. Vias 157, 159, and 161 reside within interlayer dielectric layer 112. Passivation layer 114 resides on top of interlayer dielectric layer 112.

Cross-section 140 of FIG. 15 thus shows that capacitor 1 can be formed as part of an integrated circuit structure that includes resistors and inductors and also has electrical interconnection structures that allow electrical connection to other circuitry and devices as well as connection to the external world.

Figure 16:
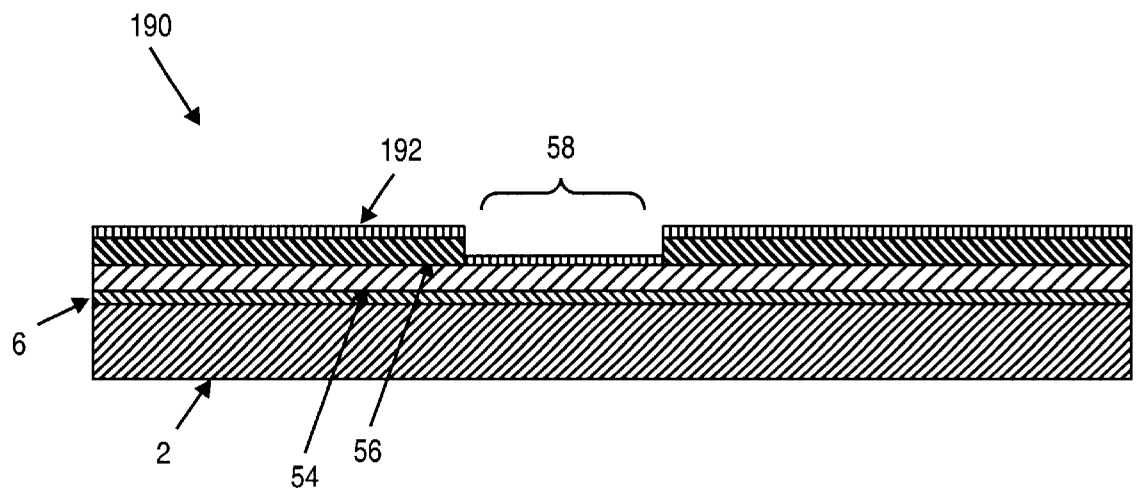
FIG. 16 shows a cross-section wherein a lift-off process has been used to deposit the dielectric layer over the top of the photoresist, which is a step in an alternative process flow for forming a capacitor.
Figure 17:
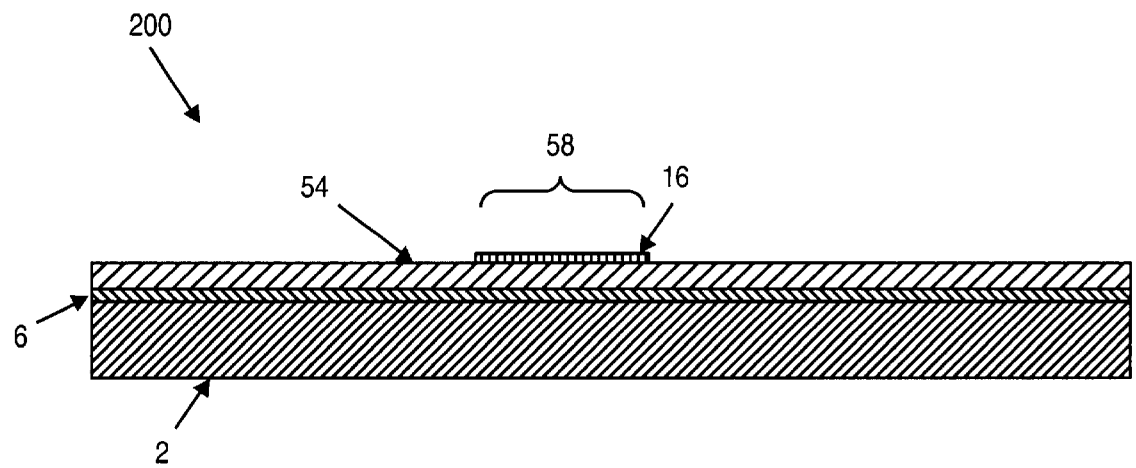
FIG. 17 shows a cross-section showing the structure containing a dielectric after the photoresist has been stripped, which is a stop in the alternative process flow for forming the capacitor.
Figure 18:
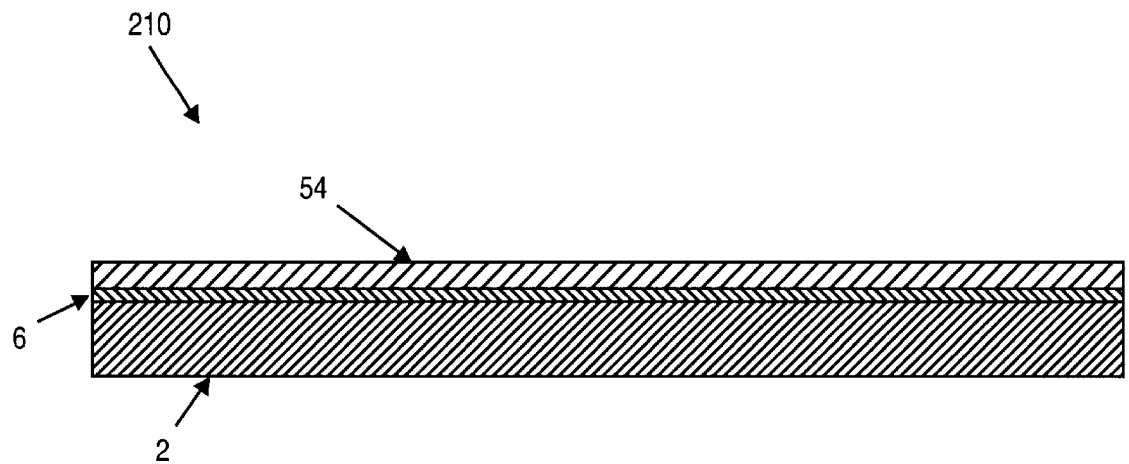
FIG. 18 shows a cross-section wherein a metal that need not be anodizable has been deposited on a substrate, which is a step in an alternative process flow for forming a capacitor.

FIGS. 16 and 17 illustrate respective cross-sections 190 and 200 showing alternative steps in a process flow for forming capacitor 1. FIGS. 16 and 17 illustrate cross-sections associated with a lift-off technique for forming dielectric layer 16. The technique illustrated in FIG. 16 is an alternative to the anodization step shown in FIG. 8.

Instead of anodizing area 58 to form dielectric layer 16, as shown in FIG. 8, the technique associated with FIG. 16 calls for depositing a dielectric layer 192 over the entire photoresist layer 56 as well as over opening 58. A lift-off process is then used to remove both the dielectric layer and photoresist layer 56 that does not reside within area 58. In other words, all of layer 192 except for that residing within area 58 is removed. The results are shown as cross-section 200 in FIG. 17. After the lift-off process occurs, all that is left of dielectric layer 192 is portion 16, which forms dielectric layer 16, which resides over metal layer 54.

For the lift-off process associated with FIGS. 16 and 17, the dielectric layers 192 and 16 are not formed from anodization. Thus dielectric layers 192 and 16 are not anodization layers. For one embodiment, dielectric layers 192 and 16 are made of silicon nitride. For other embodiments, dielectric layers 192 and 16 can be made of other materials, such as silicon dioxide or silicon oxynitride.

For an alternative embodiment, dielectric layers 192 and 16 can be made of aluminum oxide.

For the embodiment where the dielectric layer 192 of FIG. 16 is made of silicon nitride, the layer 192 can be deposited by various deposition methods. For example, for one embodiment, the silicon nitride layer 192 is deposited by an electron beam evaporation process. For another embodiment, sputtering is used to deposit the silicon nitride layer 192—for example, collimator sputtering.

The lift-off process relies on the geometry of the photoresist. The photoresist layer 56 should be thicker than the deposited layer 192. For example, for certain materials, the photoresist layer 56 should be thicker by a factor of two or more than the deposited layer 192. Nevertheless, this thickness ratio may vary depending upon the type of photoresist used for layer 56 and the type of material used for the dielectric layer 192.

The profile of opening 58 should be defined as having a vertical or re-entrant profile in photoresist layer 56. This is to help to ensure that when layer 192 is deposited over photoresist layer 56, the layer 192 is not able to form a continuous deposited film down the sides of the opening 58. The lift-off process relies on a break in the layer 192 on each vertical edge of opening 58 to allow a photoresist stripper to penetrate and remove the photoresist layer 56 together with the layer 192 above layer 56.

Methods of achieving the vertical or re-entrant profile are described in the prior art and can be done with a wide variety of photoresist materials.

For the lift-off process illustrated in FIGS. 16 and 17, the subsequent processing steps in order to form capacitor 1 are the same as those associated with FIGS. 10–13 described above.

FIGS. 18–22 illustrate cross-sections associated with alternative process flow steps for forming capacitor 1. As a first step in the alternative process, metal layer 54 is deposited on top of oxide layer 6, which in turn resides on substrate 2. For one embodiment of the invention, metal layer 54 is deposited by sputtering. For alternative embodiments, other deposition methods could be used. For example, deposition could be by evaporation or electroplating.

For the alternative process of FIGS. 18–22, metal layer 54 need not be an anodizable metal. Any conductive metal is appropriate that can be deposited. This is a significant difference from the process flow shown in FIGS. 6–13.

Nevertheless, the metal layer 54 can be an anodizable metal. In other words, layer 54 can be made of any metal.

Figure 19:
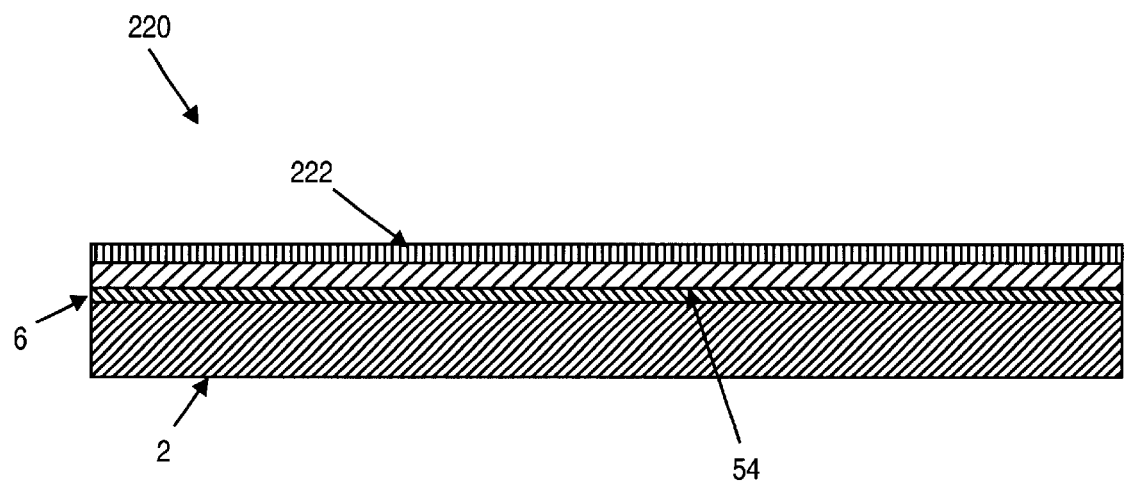
FIG. 19 shows a cross-section wherein a dielectric layer has been deposited on top of the metal layer, which is a step in the alternative process flow for forming the capacitor.

As shown by cross-section 220 in FIG. 19, the next process flow step is to deposit a dielectric layer 222 on top of metal layer 54. The dielectric layer 222 need not be an anodized layer. If metal layer 54 is not an anodizable metal, then dielectric layer 222 is not an anodized layer. On the other hand, if metal layer 54 is an anodizable metal layer, then dielectric layer 222 can be an anodized dielectric layer.

For one embodiment, dielectric layer 222 is not an anodized layer. For one embodiment, dielectric layer 222 is comprised of silicon nitride. For alternative embodiments, dielectric layer is comprised of other materials, such as silicon dioxide or silicon oxynitride.

For the embodiment of the invention wherein dielectric layer 222 is made of silicon nitride, the silicon nitride layer 222 can be deposited by a plasma-enhanced chemical vapor deposition ("PECVD") system using a model AKT 1600 CVD system supplied by Applied Komatsu Technology, Inc. of Santa Clara, Calif. For one embodiment, the PECVD condition used is $SiH_4/NH_3/N_2$ equals 100/500/3,500 sccm, 1.2 Torr, 1,200 watts, 320 degrees Centigrade, and a duration of 360 seconds, which results in a thickness of dielectric layer 222 of approximately 6,000 Angstroms.

Alternative techniques for depositing silicon nitride layer 222 include sputtering, evaporation, atmospheric chemical vapor deposition, low pressure chemical vapor deposition, laser ablation deposition, and ECR plasma chemical vapor deposition, for example.

Figure 20:
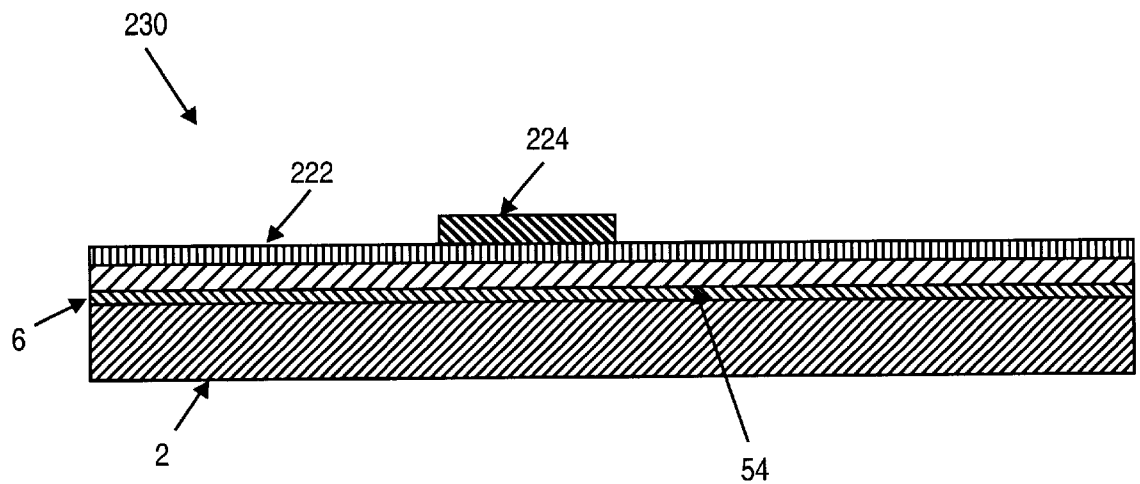
FIG. 20 shows a cross-section wherein an etch mask has been formed over a portion of the dielectric layer, which is a step in the alternative process flow forming the capacitor.

As shown by cross-section 230 in FIG. 20, the next step for the alternative process flow is to deposit photoresist layer 224 on top of dielectric layer 222. Standard photolithography processes are used to make such deposition.

Figure 21:
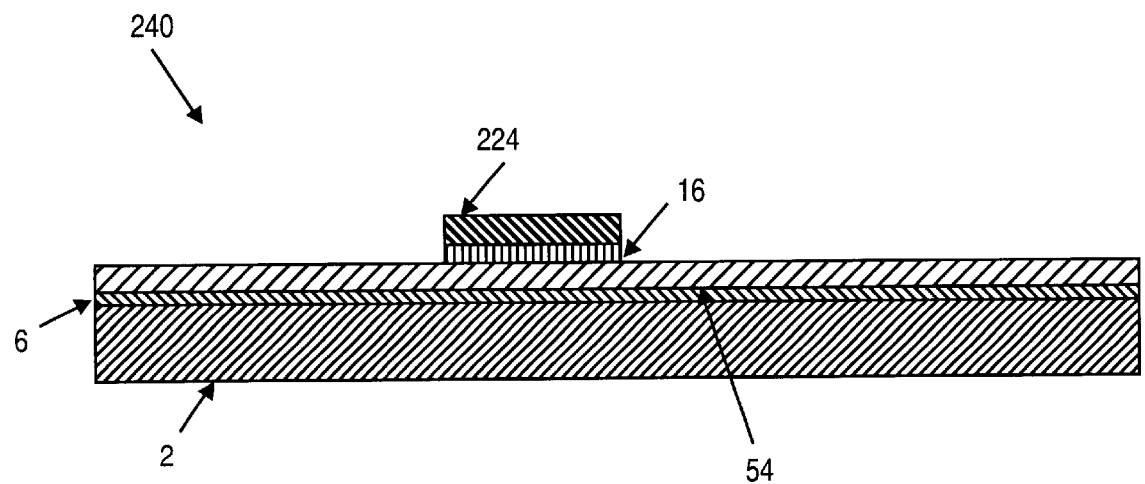
FIG. 21 shows a cross-section wherein the dielectric not under the etch mask has been etched away, which is a step in the alternative process flow for forming the capacitor.

As shown by cross-section 240 in FIG. 21, the next process flow steps involve etching away the unwanted portions of dielectric layer 222. In other words, the portions of dielectric 222 that do not underlie photoresist layer 224 are etched away. The resulting structure is having photoresist layer 224 covering dielectric layer 16.

For dielectric layer 222 comprised of silicon nitride, the silicon nitride layer 222 can be etched using a reactive ion etch ("RIE") system using a model AKT 1600 ETCH system of Applied Komatsu Technology, Inc. of Santa Clara, Calif. For one embodiment, the RIE condition used is $SF_6/O_2/Ar$ equals 300/10/150 Sccm, 40 mTorr, 900 watts, which results in etching a 6,000 Angstrom thick layer 222 of silicon nitride in approximately 150 seconds. The etching end point is detected by an optical end point detector.

Alternative techniques for performing the etching of silicon nitride layer 222 include plasma etch, ion milling, wet etch, and microwave downstream etch, for example.

Figure 22:
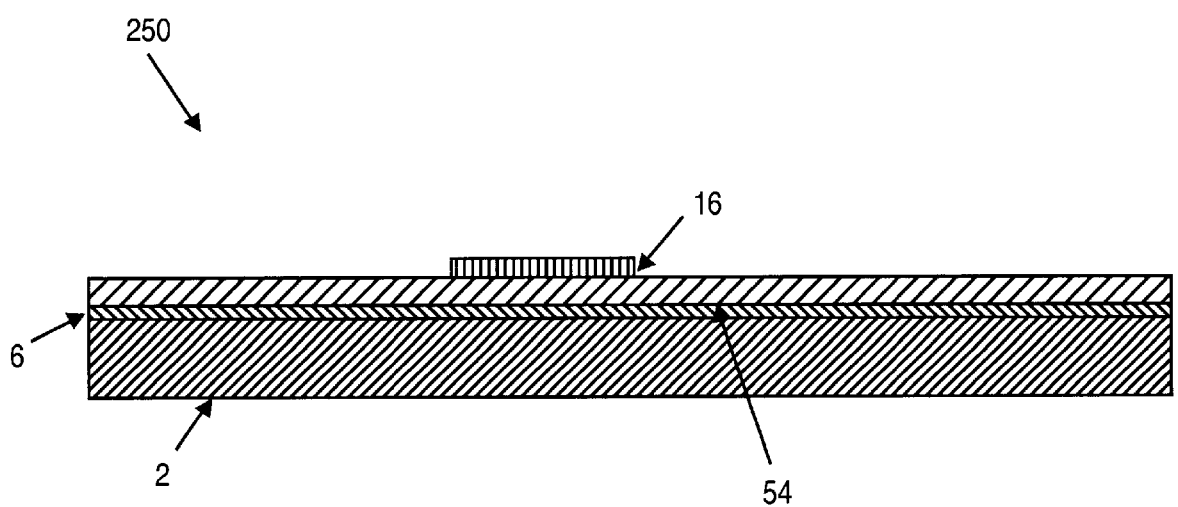
FIG. 22 shows a cross-section wherein the photoresist has been removed, which is a step in the alternative process flow for forming the capacitor.

The next process flow step is to remove the photoresist layer 224 using a photoresist stripper. The resulting structure after the photoresist is removed is shown as cross-section 250 in FIG. 22. The result is having a dielectric layer 16 over metal layer 54. After the cross-section 250 shown in FIG. 22 is fabricated, the process flow steps associated with FIGS. 10–13 can be used to form capacitor 1. In addition, capacitor 1 can be incorporated into integrated circuit structures, such as those shown in FIGS. 14 and 15.

Alternative steps can be associated with the process flow of FIGS. 18–22. For example, an interlayer can be deposited prior to the deposition of metal layer 54. Adhesion promoter layers can be used. Oxide layer 6 need not be used. Substrate 2 can be glass. In other words, the alternative embodiments associated with the process flow of FIGS. 6–13 can be used for the process flow of FIGS. 18–22.

One of the advantages of the process flow of FIGS. 18–22 is the fact that the metal layer 54 need not be an anodizable metal. The elevated temperature hard baking process flow steps associated with the process flow of FIGS. 6–13 also need not be used.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A structure comprising:
   (1) a dielectric layer having a first face, a second face, and at least one edge;
   (2) a common interconnect for a first capacitor and a second capacitor, wherein the common interconnect covers at least a portion of the first face of the dielectric layer, covers at least one edge of the dielectric layer, and covers a portion of the second face of the dielectric layer;

(3) a terminal of the first capacitor, wherein the terminal of the first capacitor covers a first portion of the second face of the dielectric layer and does not contact the common interconnect;

(4) a terminal of the second capacitor, wherein the terminal of the second capacitor covers a second portion of the second face of the dielectric layer and does not contact the common interconnect and the terminal of the first capacitor.

2. The structure of claim 1, wherein the common interconnect is coupled to a substrate.

3. The structure of claim 1, wherein the common interconnect is comprised of a material that is anodizable and electrically conductive.

4. The structure of claim 1, wherein the dielectric layer is an anodization layer.

5. The structure of claim 1, wherein the dielectric layer is not an anodization layer.

6. A capacitor comprising:

(1) a dielectric layer having a first face, a second face, and at least one edge;

(2) a first terminal having a first conductive layer that covers at least a portion of the first face of the dielectric layer, and a second conductive layer that covers a portion of the second face of the dielectric layer and all edges of the dielectric layer;

(3) a second terminal that covers a portion of the second face of the dielectric layer and does not contact the first terminal.

7. The capacitor of claim 6, wherein the first terminal covers substantially all of the first face of the dielectric layer.

8. The capacitor of claim 6, wherein the second conductive layer covers the portion of the second face of the dielectric layer at the perimeter region of the second face of the dielectric layer.

9. The capacitor of claim 6, wherein the first and second conductive layers are made of a same material.

10. The capacitor of claim 6, wherein the first and second conductive layers are made of different materials.

11. The capacitor of claim 6, wherein the first terminal is coupled to a substrate.

12. The capacitor of claim 11, wherein the substrate is comprised of a material selected from a group consisting of a silicon, a ceramic, a glass, a plastic, and a semiconductor.

13. The capacitor of claim 11, wherein the substrate is a silicon wafer having an insulating layer in contact with the first terminal.

14. The capacitor of claim 13, wherein the insulating layer is an oxide of silicon.

15. The capacitor of claim 6, wherein the first terminal is comprised of a material that is anodizable and electrically conductive.

16. The capacitor of claim 15, wherein the first terminal is comprised of a material selected from a group consisting of aluminum, tantalum, and alloys thereof.

17. The capacitor of claim 6, wherein the dielectric layer is an anodization layer.

18. The capacitor of claim 17, wherein the dielectric layer is comprised of aluminum oxide.

19. The capacitor of claim 6, wherein the dielectric layer is comprised of tantalum oxide.

20. The capacitor of claim 6, wherein the dielectric layer is not an anodization layer.

21. The capacitor of claim 20, wherein the dielectric layer is comprised of silicon nitride.

* * * * *